(12) United States Patent
French et al.

(10) Patent No.: US 7,300,743 B2
(45) Date of Patent: Nov. 27, 2007

(54) RADIATION DURABLE ORGANIC COMPOUNDS WITH HIGH TRANSPARENCY IN THE VACUUM ULTRAVIOLET, AND METHOD FOR PREPARING

(75) Inventors: Roger Harquail French, Wilmington, DE (US); David Joseph Jones, Wilmington, DE (US); Robert Clayton Wheland, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 411 days.

(21) Appl. No.: 10/632,643

(22) Filed: Aug. 1, 2003

(65) Prior Publication Data

US 2004/0175647 A1  Sep. 9, 2004

Related U.S. Application Data

(63) Continuation-in-part of application No. 10/382,695, filed on Mar. 6, 2003, now abandoned.

(51) Int. Cl.
*G03C 1/00* (2006.01)
*C08F 14/18* (2006.01)

(52) U.S. Cl. .............. 430/273.1; 430/270.1; 526/250; 210/664; 210/663

(58) Field of Classification Search .......... None
See application file for complete search history.

(56) References Cited

U.S. PATENT DOCUMENTS

| 4,508,814 | A | * | 4/1985 | Sakurai et al. ............. 430/303 |
| 4,678,850 | A | * | 7/1987 | Hatzakis et al. ........... 526/293 |
| 4,975,300 | A | * | 12/1990 | Deviny .................... 427/509 |
| 6,193,952 | B1 | | 2/2001 | Kabalnov et al. |
| 6,824,930 | B1 | * | 11/2004 | Wheland et al. ............. 430/5 |
| 2005/0074704 | A1 | | 4/2005 | Endo et al. |

FOREIGN PATENT DOCUMENTS

| WO | WO 01/37044 | 5/2001 |
| WO | WO 01/85811 | 11/2001 |

OTHER PUBLICATIONS

M. Switkes, et al., "Immersion Liquids for Lithography in the Deep Ultraviolet", Optical Microlithography, Proceedings of SPIE, vol. 5040, (2003) pp. 690-699, Massachusetts.

Ray, Suprakas, et al., "Biodegradable Polylactide/Montmorillonie Nanocomposites", J. Nonosci. Nanotech, vol. 3, No. 6, (2003), Japan.

Switkes, M,, et al., "Resolution Enhancement of 157 nm Lithography by Liquid Immersion", Optical Microlithography, Proceedings of SPIE, vol. 4691, (2002) pp. 459-465, Massachusetts.

A.C. Fozza, et al., "Vacuum Ultraviolet Irradiation of Polymers", Plasmas and Polymers, vol. 4, No. 2/3, (1999) pp. 183-206, Canada.

M. Switkes, et al., "Immersion lithography: Beyond the 65nm node with optics", Microlithography World, pp. 4-20, Massachusetts.

J. Schiers, Perfluoropolyethers, p. 441.

Chemical Abstracts, 23-Aliphatic Compounds, vol. 127, (1997), p. 633.

Reactions of Organic Fluorine Compounds, pp. 174-175.

G. Belanger, et al., "Chemical Physics Letters", vol. 3, No. 8, (1969) pp. 649-651, Canada.

Ichinose, Nobuyuki, et al., "Communications to the Editor", Macromolecules 1996, vol. 29, pp. 4155-4157, Neyagawa.

Lombos, B.A., "The Electronic Spectra of Normal Paraffin Hydrocarbons", Chemical Physics Letters, (1967). pp. 42-43, Canada.

M. Switkes, et al., "Immersion lithography at 157 nm", J.Vac. Sci. Technol. B, vol. 19, No. 6, (2001), pp. 2353-2356, Massachusetts.

M. Hudlicky, et al., "Hydrogenolysis of Carbon-Fluorine Bonds in Catalytic Hydrogenation", Journal of Fluorine Chemistry, vol. 14 (1979), pp. 189-199, Virginia.

V.N. Vasilets, et al., "Photolysis of a Fluorinated Polymer Film by Vacuum Ultraviolet Radiation", Journal of Polymer Science, vol. 36, (1997) pp. 2215-2222, Japan.

Seki, Kazuhiko, et al., "Electronic Structure of Poly(tetrafluorethylene) Studied by UPS, VUV Absorption, and Band Calculations ", Physica Scripta, vol. 41, (1989) pp. 167-171, Japan.

B.B. Lepehort, et al., p. 80-83.

Scheirs, John, et al., "Perfluoropolyethers (Synthesis, Characterization and Applications", Modern Fluoropolymers, (1997), pp. 434-485.

* cited by examiner

*Primary Examiner*—Mark F. Huff
*Assistant Examiner*—Daborah Chacko-Davis

(57) ABSTRACT

This invention concerns radiation durable organic compositions which are well-suited for use in 157 nm lithography by virtue of their high transparency and excellent radiation durability, and to a process for the preparation thereof.

36 Claims, 10 Drawing Sheets

Harrick: DLC-M13: Demountable Liquid Cell

Figure 7 describes the absorbance in units of inverse centimeters for Freon-E2 (example 10) versus wavelength lambda ($\lambda$) in units of nanometers.

Figure 8 describes the absorbance in units of inverse centimeters for Perfluoro-E2 (example 12) versus wavelength lambda ($\lambda$) in units of nanometers.

Figure 9 describes the absorbance in units of inverse centimeters for Perfluoro(1,3-dimethylcyclohexane) (example C9) versus wavelength lambda ($\lambda$) in units of nanometers.

Figure 10

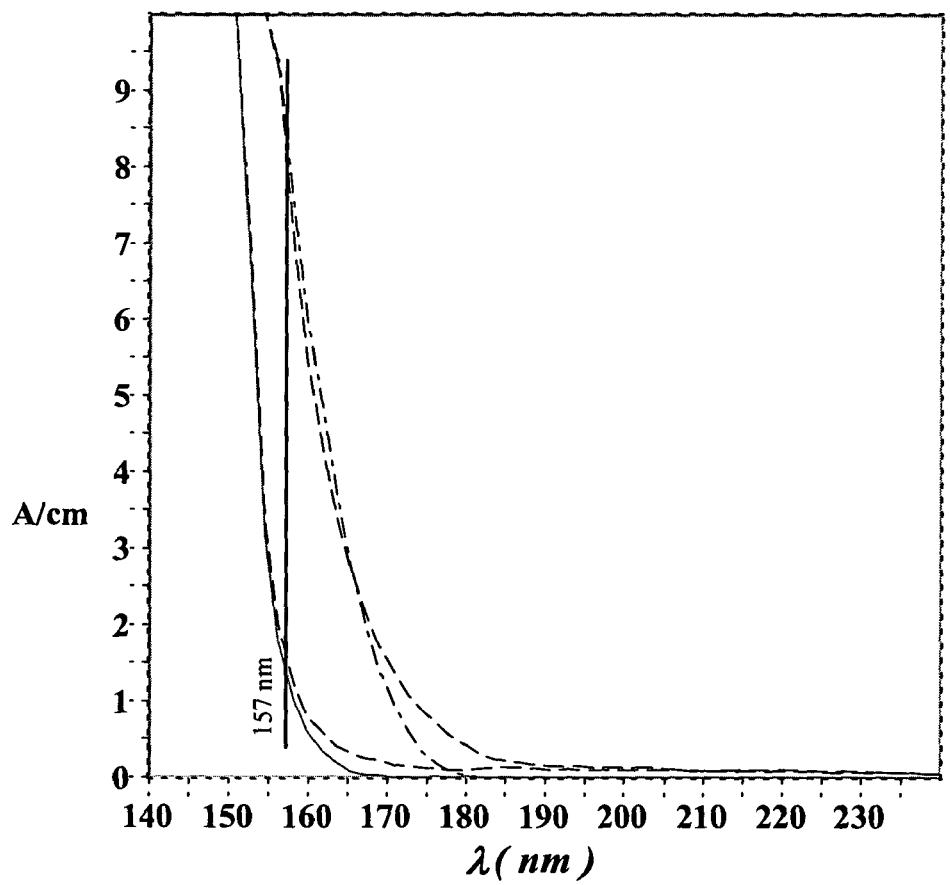

Figure 10 describes the absorbance in units of inverse centimeters for Perfluoro-N-methymorpholine (example 11) versus wavelength lambda ($\lambda$) in units of nanometers for a sample a) loaded in Air (dash dot line), b) loaded in $N_2$ (dotted line), c) loaded in $N_2$ and shaken with water (dashed line), and d) loaded in $N_2$ (solid line) shaken with water and dried with 3A molecular sieves.

Figure 12 describes the absorbance in units of inverse centimeters for 1,1,1,3,3-Pentafluorobutane (example 13) versus wavelength lambda ($\lambda$) in units of nanometers for a sample a) loaded in Air (dashed line), b) loaded in $N_2$ after bulb to bulb distillation (solid line).

RADIATION DURABLE ORGANIC COMPOUNDS WITH HIGH TRANSPARENCY IN THE VACUUM ULTRAVIOLET, AND METHOD FOR PREPARING

FIELD OF THE INVENTION

This invention is directed to the development of transparent materials suitable for use in the region of the electromagnetic spectrum known as the vacuum ultraviolet (VUV). In particular, this invention is directed to fluorinated organic compositions which are particularly well-suited for use in optical processes in the vacuum ultraviolet by virtue of their high transparency and excellent photochemical stability, and to a process for the preparation thereof. The compositions of the invention are particularly well-suited for use in photolithographic processes in the VUV used for the fabrication of shaped articles particularly integrated electronic and integrated optical circuit elements particularly at wavelengths of 157 nm and 193 nm.

TECHNICAL BACKGROUND OF THE INVENTION

Much progress in the electronics industry comes from circuit size reduction. This is most directly accomplished by running photolithographic processes at ever-shorter wavelengths of light. The electronics industry is currently implementing photolithographic processes employing wavelengths in the so-called "vacuum ultra-violet" (VUV). Processes using 193 nanometer (nm) light undergoing commercialization while 157 nm wavelength light is under development as a next generation candidate.

Whether a polymer or a lower molecular weight organic composition, if the material resides in the light path between the source and the target, the material needs to be transparent and photochemically stable.

For a material to be useful in VUV photolithography it is necessary but not sufficient that it exhibit high transparency, particularly at 157 nm and 193 nm; it must also exhibit high photochemical stability known in the art as radiation durability. Radiation durability is the property of a material to retain transparency upon being subject to exposure to electromagnetic radiation of a particular frequency. In many aspects of photolithography, commercial considerations require a transparent material to retain a high degree of transparency while being subject to a significant cumulative dose of radiation.

Vacuum ultraviolet radiation is of sufficiently high energy to break chemical bonds in some normally stable materials resulting in the formation of highly reactive free-radicals. It will be appreciated by one of skill in the art that the generation of a small number of free radicals can have catastrophic effects on the chemical stability of the host material by virtue of a free-radical chain reaction. The role of free-radicals in photochemical degradation of materials is well known. There are many types of free radicals, including hydroxyl radicals, oxygen radicals, and organic radicals. These free radicals are generated when sufficient energy is absorbed by a precursor molecule to cause it to dissociate non-ionically, forming species of neutral charge but sporting an unpaired electron.

Titze in *Photodissoziation von $H_2O$ bei 157 nm*, Max Planck Inst., Gottingen, Germany, 1984, discloses photolysis of water at 157 nm to form hydrogen and hydroxide radicals.

A. C. Fozza, J. E. Klemberg-Sapieha, and M. R. Wertheimer, *Plasmas and Polymers*, Vol. 4, No. 2/3, 1999, pages 183-206, discusses oxygen's undergoing photo-dissociation to activated oxygen atoms at wavelengths less than 170 nm. Also disclosed are bond breaking reactions that occur in the vacuum ultraviolet with polyethylene, polystyrene, and polymethymethacrylate. V. N. Vasilets, I. Hirata, H. Iwata, Y. Ikada, *Journal of Polymer Science: Part A: Polymer Chemistry*, Vol 36, 2215-2222 (1998) discusses radical formation and photooxidation when tetrafluoroethylene/hexafluoropropylene copolymer is irradiated with 147 nm light:

N. Ichinose and S. Kawanishi, *Macromolecules*, 1996, 29, 4155-4157 discloses the irradiation of polymers such as Teflon® PTFE, Teflon® FEP, Teflon® PFA, Tefzel®, and polyvinylidene fluoride with light at 185, 193, 248, and 254 nm. When the polymer surface was in contact with nitrogen-purged water, extensive surface reaction was detected. The surface reactivity was particularly apparent at 185, 193, and 248 nm but much less so if at all at 254 nm. Perfluorinated polymers such as Teflon® PTFE and Teflon® PFA reacted more readily than partially fluorinated polymers such as Tefzel® and polyvinylidene fluoride. No significant photochemistry was observed in the absence of water. Saturation of the water with oxygen also completely inhibited the surface chemistry. It is further taught that water starts to absorb around 190 to 200 nm and that photons of wavelengths shorter than 191-207 nm have sufficient energy to exceed the threshold ionization energy of liquid water.

It is very well-known in the art that oxygen radicals, which are produced by numerous means, are highly reactive with a tremendous range of materials, causing degradation both in the presence and absence of water, depending upon the specific circumstances. Prevention of oxidation is a large and complex art in itself, with a long history.

One new development in the field is so-called immersion lithography as described in Switkes et al, *J. Vac. Sci. Technol. B*, 19 (6), 2353 6, November/December 2001; and, M. Switkes et al, "Resolution enhancement of 157-nm lithography by liquid immersion", *Proc. SPIE* Vol. 4691, pp. 459465 (2002). In immersion lithography, the optical source, the target surface, or the entire lithographic apparatus is immersed in a highly transparent high refractive index liquid. Realization of the potential benefits of this technology is dependent upon identifying liquids with exceptionally high transparency in the VUV with excellent photochemical stability, as described, for example, in M. Switkes, R. R. Kunz, M. Rothschild, R. F. Sinta, P. M. Gallagher-Wetmore, and V. J. Krukonis, "Liquids for immersion lithography at short wavelengths", *Proc. SPIE* Vol. 5040, 690-699 (2003).

Switkes et al, *Microlithography World*, May 2003, pp. 4ff, further demonstrate that light in a high refractive index medium can simulate the effects of much shorter wavelength light for photolithographic purposes. 193 nm light can be made to behave as though it has a wavelength of 136 nm and 157 nm light can be made to behave as though it has a wavelength of 115 nm by completely filling the gap between lens and wafer with a liquid fluorocarbon called an immersion fluid. According to Switkes et al, "Liquids for immersion lithography at short wavelengths," op. cit., an immersion liquid layer must be at least 1 mm thick for mechanical reasons and at least 95% transparent for good optical performance. A reasonable estimate of the needed absorbance for an immersion liquid is A/cm=0.22, as determined from the equation $$A/cm \leq [\log_{10}(T_0/T)]/h = [\log_{10}(100\%/95\%)]/0.1 = 0.22$$

Where To=light intensity in the absence of immersion fluid

T=light intensity with immersion fluid present h=distance from lens to resist in centimeters In general, of course, the more transparent the better.

All known organic materials absorb to some extent at 157 nm. B. A. Lombos et al *Chemical Physics Letters*, 1, 42 (1967) discloses that short chain hydrocarbons H(CH2)nH with n<2; and G. Belanger et al Chemical Physics Letters, 3(8), 649(1969), and K. Seki, et al, Phys. Scripta, 41, 167(1990) disclose that short chain fluorocarbons F(CF2)nF with $n \leq 6$ to 10 are likely to be relatively transparent compared to longer chain homologues. French et al, WO 01/37044 and WO 01/85811 disclose polymers having alternating fluorocarbon segments and hydrocarbon segments which are much more transparent materials at 157 nm than either (CH2)n or (CF2)n as chain lengths grow longer.

There is a need for lower molecular weight organic compositions, particularly liquids, which may be employed, for example, as solvents for the polymer during spin coating, as plasticizers for polymeric films, or in an adhesive formulation. Alternatively, an organic fluid or gel may be employed as an immersion medium in immersion photolithography, as disclosed for example by Switkes and Rothschild, op. cit., in which a liquid medium is used between the projection lens of the optical stepper and the photoresist coated substrate (typically a silicon wafer) which will receive and detect the photolithographic image.

Hydrofluorocarbons having the general formula $C_nF_{2n+2-x}H_x$ are well known in the art, and are readily prepared by known methods. One such method is the addition of hydrogen across the double bond of a fluoroolefin or a hydrofluorocarbon olefin using nickel or palladium as a catalyst as described in M. Hudlicky, Chemistry of Organic Fluorine Compounds, $2^{nd}$ Edition, John Wiley and Sons, New York, 1976 pages 174 and 175. In the alternative, said hydrofluorocarbons may be prepared by the reduction of Br, Cl, and I atoms in fluorocarbons or hydrofluorocarbons to H with inorganic reducing agents such as LiAlH4 or Zn as described in Hudlicky, op. cit., page 182 or alternatively on page 189. In yet another method, said hydrofluorocarbons may be prepared using organic reducing agents such as tributyitinhydride as described in Hudlicky, op. cit., page 197.

$F[CF(CF_3)CF_2O]nCF_2CF_3$, is known in the art, as described in, Modern Fluoropolymers, J. Scheirs, editior Chapter 24, "Perfluoropolyethers (Synthesis, Characterization, and Applications)" John Wiley & Sons, New York, 1997. $F[CF(CF_3)CF_2O]_nCFHCF_3$ where n=1 to 5 comes from an intermediate in the synthesis of $F[CF(CF_3)CF_2O]nCF_2CF_3$ in which a —COOH end group has been thermolysed to hydrogen rather than converted to —F with fluorine gas. $X-R_f^a[OR_f^b]nOR_f^cY$ wherein X and Y can be hydrogen or fluorine and $R_f^a$, $R_f^b$, and $R_f^c$ are 1 to 3 carbon fluorocarbon radicals, linear or branched is a known variation of $F[CF(CF_3)CF_2O]nCF_2CF_3$, also described in *Modern Fluorpolymers*, op. cit. $HCF_2(OCF_2)_n(OCF_2CF_2)_mOCF_2H$ where n+m=1 to 8 is a variation of the synthesis of said $X-R_f^a[OR_f^b]nOR_f^cY$ in which the end groups are not fluorinated but rather diverted to other chemistry as described in *Modern Fluoropolymers*, op. cit., on p. 441 happens to show end groups being reduced to CH2OH rather than converted to H). Not all of the variations implied by the generic formulas may be known or easily made: for example Class ii where one has $H[CF(CF_3)CF_2O]_nCF_2H$.

$CF_3CH_2CF_2CH_3$ is known to be synthesized by reacting $CCl_4$ and $CH_2=CClCH_3$ to give $CCl_3CH_2CCl_2CH_3$, and then replacement of the chlorines by treatment in hydrofluoric acid. See R. Bertocchio, A. Lantz, L. Wedlinger, *Chem. Abstracts* 127:161495.

Polyperfluoroformaldehyde has not been reported except U.S. Pat. No. 6,193,952 described using $[CF_3O(CF_2O)_nCF_3]$ (n=1-4) as a gas emulsion agent for ultrasound contrast enhancement. However, that patent does not teach how to prepare these compounds. Perfluoroether, $CF_3OCF_2OCF_2CF_2OCF_2OCF_3$, has been reported by direct fluorination from the corresponding hydrocarbon ether (U.S. Pat. No. 5,322,904). Electrochemical dimerization of fluoroacid, $CF_3OCF_2CF_2CO_2H$, has been reported (Novosti Elektrokhim. Org. Soedin., Tezisy Dokl. Vses. Soveshch. Elektrokhim. Org. Soedin., $8^{th}$ Meeting Date 1973, 31-2. CA 82:36563).

SUMMARY OF THE INVENTION

The present invention provides for an organic composition characterized by an absorbance/micrometer of <1 at wavelengths from 140 to 260 nm, said composition comprising less than 20 parts per million of water, less than 90 ppm of oxygen, and one or more compounds selected from the group consisting of:

i) cyclic, linear, or branched hydrofluorocarbons having 2 to 10 carbon atoms in which there are more fluorines than hydrogen, no runs of adjacent C—H bonds longer than two (CH—CH), no runs of adjacent C—F bonds longer than 6 (CF—CF—CF—CF—CF—CF), and no —CH$_2$CH$_3$ radicals;

ii) $X-R_f^a[OR_f^b]nOR_f^cY$ wherein X and Y can be hydrogen or fluorine and $R_f^a$, $R_f^b$, and $R_f^c$ are 1 to 3 carbon fluorocarbon radicals, linear or branched in which there are more fluorines than hydrogens, no runs of adjacent C—H bonds longer than two are present, no —CH$_2$CH$_3$ radicals are present and no sequences with hydrogen on both sides of an ether oxygen (CH—O—CH) are present;

iii) $C_nF_{2n-v+2}H_v$ wherein n=2 to 10, v<n+1, the number of fluorines equals or exceeds the number of hydrogens, no runs of adjacent C—H bonds longer than two are present, no runs of adjacent C—F bonds longer than 6 are present, and no CH$_2$CH$_3$ radicals are present;

iv) $C_nF_{2n+1}CFHCFHC_mF_{2m+1}$ where n equals 1 to 4; and m equals 1 to 4;

v) $CF_3CH_2CF_2CH_3$;

vi) $F[CF(CF_3)CF_2O]_nCFHCF_3$ where n=1 to 5;

vii) $F[CF(CF_3)CF_2O]_nCF_2CF_3$ where n=1 to 5;

viii) $HCF_2(OCF_2)_n(OCF_2CF_2)_mOCF_2H$ where n+m=1 to 8;

ix) cyclic, linear, or branched hydrofluorocarbon amines and ether-amines in which there are more fluorines than hydrogens, no runs of hydrogen longer than two (CH—CH), no —CH$_2$CH$_3$ radicals are present and no runs of adjacent C—F bonds longer than 6 (CF—CF—CF—CF—CF—CF), and no C—H bonds immediately adjacent to either nitrogen or oxygen and, x) $XR_f^a(OR_f^b)w(OR_f^c)_x(OR_f^d)_yOR_f^eY$ where X=H or F; $R_f^a$ and $R_f^e$ are independently a linear or branched fluoroalkyl radical of 1 to 3 carbons; $R_f^b$, $R_f^c$, and $R_f^d$ are linear or branched fluoroalkenyl radicals of 1-3 carbons; and w, x, and y=0 to 10 with the proviso that w+x+y>2.

The present invention further provides a process for preparing an organic composition characterized by an absorbance/micrometer of <1 at wavelengths from 140 to 260 nm, comprising subjecting to treatment with one or more means for extracting one or more photochemically active species, a compound selected from the group consisting of:

i) cyclic, linear, or branched hydrofluorocarbons having 2 to 10 carbon atoms in which there are more fluorines than hydrogen, no runs of adjacent C—H bonds longer than two (CH—CH), no runs of adjacent C—F bonds longer than 6 (CF—CF—CF—CF—CF—CF), and no —$CH_2CH_3$ radicals;

ii) $X—R_f^a[OR_f^b]nOR_f^cY$ wherein X and Y can be hydrogen or fluorine and $R_f^a$, $R_f^b$, and $R_f^c$ are 1 to 3 carbon fluorocarbon radicals, linear or branched in which there are more fluorines than hydrogens, no runs of adjacent C—H bonds longer than two are present, no —$CH_2CH_3$ radicals are present and no sequences with hydrogen on both sides of an ether oxygen (CH—O—CH) are present;

iii) $C_nF_{2n-v+2}H_v$ wherein n=2 to 10, v<n+1, no runs of adjacent C—H bonds longer than two are present, no runs of adjacent C—F bonds longer than 6 are present, and no $CH_2CH_3$ radicals are present;

iv) $C_nF_{2n+1}CFHCFHC_mF_{2m+1}$ where n equals 1 to 4; and m equals 1 to 4;

v) $CF_3CH_2CF_2CH_3$;

vi) $F[CF(CF_3)CF_2O]_nCFHCF_3$ where n=1 to 5;

vii) $F[CF(CF_3)CF_2O]_nCF_2CF_3$ where n=1 to 5;

viii) $HCF_2(OCF_2)_n(OCF_2CF_2)_mOCF_2H$ where n+m=1 to 8;

ix) cyclic, linear, or branched hydrofluorocarbon amines and ether-amines in which there are more fluorines than hydrogens, no runs of hydrogen longer than two (CH—CH), no —$CH_2CH_3$ radicals are present, and no runs of adjacent C—F bonds longer than 6 (CF—CF—CF—CF—CF—CF), and no C—H bonds immediately adjacent to either nitrogen or oxygen; and, x) $XR_f^a(OR_f^b)w(OR_f^c)_x(OR_f^d)_yOR_f^ey$ where X=H or F; $R_f^a$ and $R_f^e$ are independently a linear or branched fluoroalkyl radical of 1 to 3 carbons; $R_f^b$, $R_f^c$, and $R_f^d$ are linear or branched fluoroalkenyl radicals of 1-3 carbons; and w, x, and y=0 to 10 with the proviso that w+x+y>2.

at least until the desired concentration of said one or more photochemically active species is achieved.

This invention further includes a process for forming an optical image on a substrate, the process comprising:

a) radiating electromagnetic radiation from a source capable of radiating electromagnetic radiation in the range of 140-260 nm;

b) receiving said radiation on a target disposed to receive at least a portion of said radiation; and causing at least a portion of said radiation to traverse one or more optically transparent compositions disposed between said radiation source and said target, at least one of said optically transparent compositions comprising a composition comprising less than 20 parts per million of water, less than 90 parts per million of oxygen, and one or more compounds selected from the group consisting of:

i) cyclic, linear, or branched hydrofluorocarbons having 2 to 10 carbon atoms in which there are more fluorines than hydrogen, no runs of adjacent C—H bonds longer than two (CH—CH), no runs of adjacent C—F bonds longer than 6 (CF—CF—CF—CF—CF—CF), and no —$CH_2CH_3$ radicals;

ii) $X—R_f^a[OR_f^b]nOR_f^cY$ wherein X and Y can be hydrogen or fluorine and $R_f^a$, $R_f^b$, and $R_f^c$ are 1 to 3 carbon fluorocarbon radicals, linear or branched in which there are more fluorines than hydrogens, no runs of adjacent C—H bonds longer than two are present, and no sequences with hydrogen on both sides of an ether oxygen (CH—O—CH) are present;

iii) $C_nF_{2n-v+2}H_v$ wherein n=2 to 10, v<n+1, no runs of adjacent C—H bonds longer than two are present, no runs of adjacent C—F bonds longer than 6 are present, and no $CH_2CH_3$ radicals are present;

iv) $C_nF_{2n+1}CFHCFHC_mF_{2m+1}$ where n equals 1 to 4; and m equals 1 to 4;

v) $CF_3CH_2CF_2CH_3$;

vi) $F[CF(CF_3)CF_2O]_nCFHCF_3$ where n=1 to 5;

vii) $F[CF(CF_3)CF_2O]_nCF_2CF_3$ where n=1 to 5;

viii) $HCF_2(OCF_2)_n(OCF_2CF_2)_mOCF_2H$ where n+m=1 to 8;

ix) cyclic, linear, or branched hydrofluorocarbon amines and ether-amines in which there are more fluorines than hydrogens, no runs of hydrogen longer than two (CH—CH), no —$CH_2CH_3$ radicals are present and no runs of adjacent C—F bonds longer than 6 (CF—CF—CF—CF—CF—CF), and no C—H bonds immediately adjacent to either nitrogen or oxygen; and, x) $XR_f^a(OR_f^b)w(OR_f^c)_x(OR_f^d)_yOR_f^ey$ where X=H or F; $R_f^a$ and $R_f^e$ are independently a linear or branched fluoroalkyl radical of 1 to 3 carbons; $R_f^b$, $R_f^c$, and $R_f^d$ are linear or branched fluoroalkenyl radicals of 1-3 carbons; and w, x, and y=0 to 10 with the proviso that w+x+y>2.

This invention further includes a process for forming an optical image on a substrate, the process comprising:

radiating electromagnetic radiation from a source capable of radiating electromagnetic radiation in the range of 140-260 nm;

receiving said radiation on a target disposed to receive at least a portion of said radiation; and causing at least a portion of said radiation to traverse one or more optically transparent compositions disposed between said radiation source and said target, at least one of said optically transparent compositions comprising a composition treated with one or more means for extracting one or more photochemically active species, the composition comprising one or more compounds selected from the group consisting of:

i) cyclic, linear, or branched hydrofluorocarbons having 2 to 10 carbon atoms in which there are more fluorines than hydrogen, no runs of adjacent C—H bonds longer than two (CH—CH), no runs of adjacent C—F bonds longer than 6 (CF—CF—CF—CF—CF—CF), and no —$CH_2CH_3$ radicals;

ii) $X—R_f^a[OR_f^b]nOR_f^cY$ wherein X and Y can be hydrogen or fluorine and $R_f^a$, $R_f^b$, and $R_f^c$ are 1 to 3 carbon fluorocarbon radicals, linear or branched in which there are more fluorines than hydrogens, no runs of adjacent C—H bonds longer than two are present, no —$CH_2CH_3$ radicals are present and no sequences with hydrogen on both sides of an ether oxygen (CH—O—CH) are present;

iii) $C_nF_{2n-y+2}H_y$ wherein n=2 to 10, v<n+1, no runs of adjacent C—H bonds longer than two are present, no runs of adjacent C—F bonds longer than 6 are present, and no $CH_2CH_3$ radicals are present;

iv) $C_nF_{2n+1}CFHCFHC_mF_{2m+1}$ where n equals 1 to 4; and m equals 1 to 4;

v) $CF_3CH_2CF_2CH_3$;

vi) $F[CF(CF_3)CF_2O]_nCFHCF_3$ where n=1 to 5;

vii) F[CF(CF$_3$)CF$_2$O]$_n$CF$_2$CF$_3$ where n=1 to 5;

viii) HCF$_2$(OCF$_2$)$_n$(OCF$_2$CF$_2$)$_m$OCF$_2$H where n+m=1 to 8;

ix) cyclic, linear, or branched hydrofluorocarbon amines and ether-amines in which there are more fluorines than hydrogens, no runs of hydrogen longer than two (CH—CH), no —CH$_2$CH$_3$ radicals are present and no runs of adjacent C—F bonds longer than 6 (CF—CF—CF—CF—CF—CF), and no C—H bonds immediately adjacent to either nitrogen or oxygen; and, x) XR$_f^a$(OR$_f^b$)w(OR$_f^c$)$_x$(OR$_f^d$)$_y$OR$_f^e$Y where X=H or F; R$_f^a$ and R$_f^e$ are independently a linear or branched fluoroalkyl radical of 1 to 3 carbons; R$_f^b$, R$_f^c$, and R$_f^d$ are linear or branched fluoroalkenyl radicals of 1-3 carbons; and w, x, and y=0 to 10 with the proviso that w+x+y>2.

This invention further includes a process for forming an optical image on a substrate, the process comprising:

radiating electromagnetic radiation from a source capable of radiating electromagnetic radiation in the range of 140-260 nm;

receiving said radiation on a target disposed to receive at least a portion of said radiation;

wherein at least one of said target or said source is immersed in one or more optically transparent fluorinated organic liquids characterized by an absorbance per micrometer of <5 disposed between said radiation source and said target, at least one of said optically transparent fluorinated organic compounds having been subject to treatment with one or more means for extracting one or more photochemically active species.

The invention also includes selected ethers and aminoethers for use as fluids that are highly transparent to UV wavelengths ranging from about 150 to 200 nm. Uses include optical couplants, optical cements, optical elements, optical inspection media for semiconductor wafers and devices, and immersion lithography. A preferred use is as immersion fluids in lithographic imaging at 157 and 193 nm.

BRIEF DESCRIPTION OF THE DRAWINGS

FIG. 10 describes the absorbance in units of inverse centimeters for Perfluoro-N-methymorpholine (Example 11) versus wavelength lambda ($\lambda$) in units of nanometers for a sample a) loaded in Air (dash dot line), b) loaded in N$_2$ (dotted line), c) loaded in N$_2$ and shaken with water (dashed line), and d) loaded in N$_2$ (solid line) shaken with water and dried with 3A molecular sieves.

DETAILED DESCRIPTION OF THE INVENTION

Figure 1:
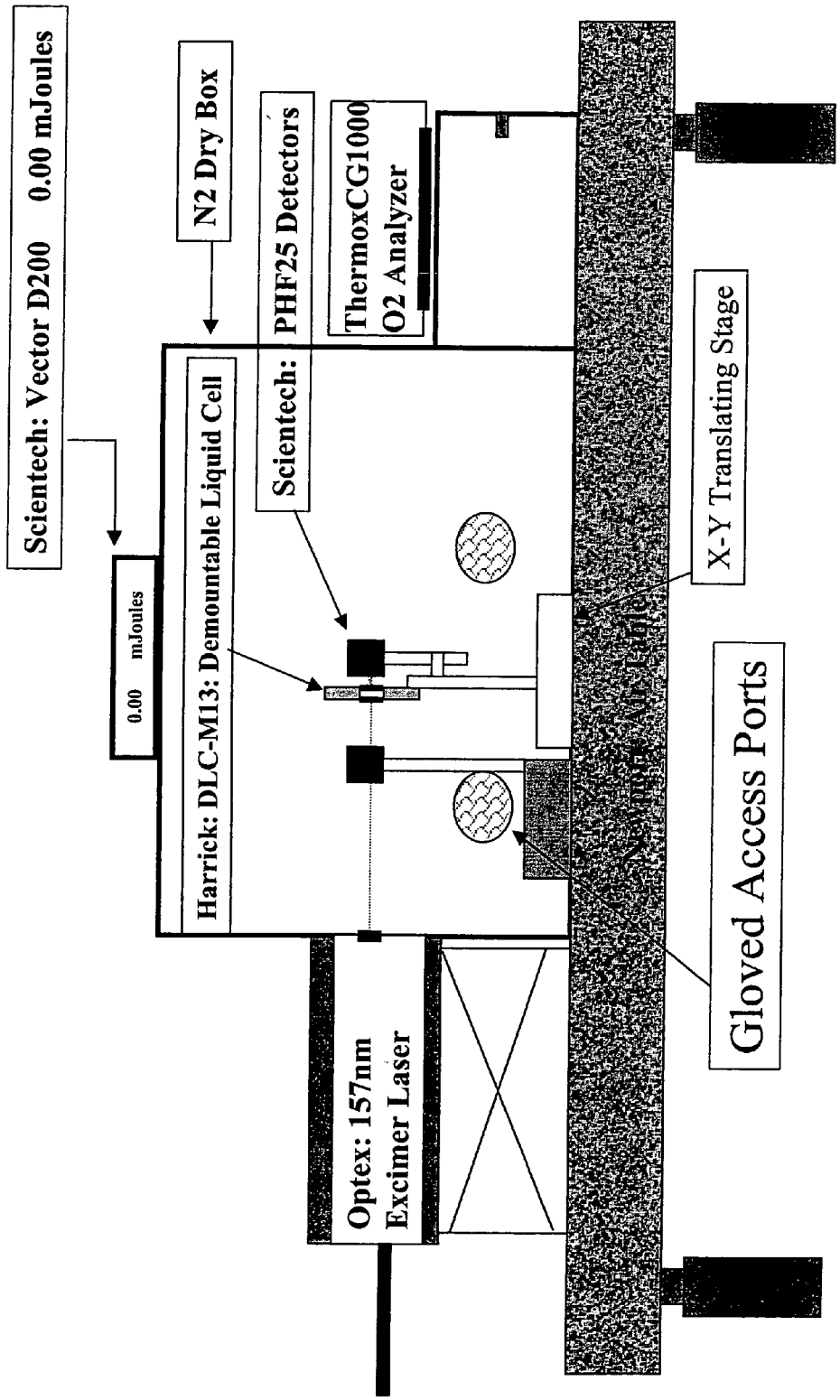
FIG. 1 shows the schematic layout of the apparatus employed for exposing a test specimen to 157 nm laser irradiation.
Figure 2:
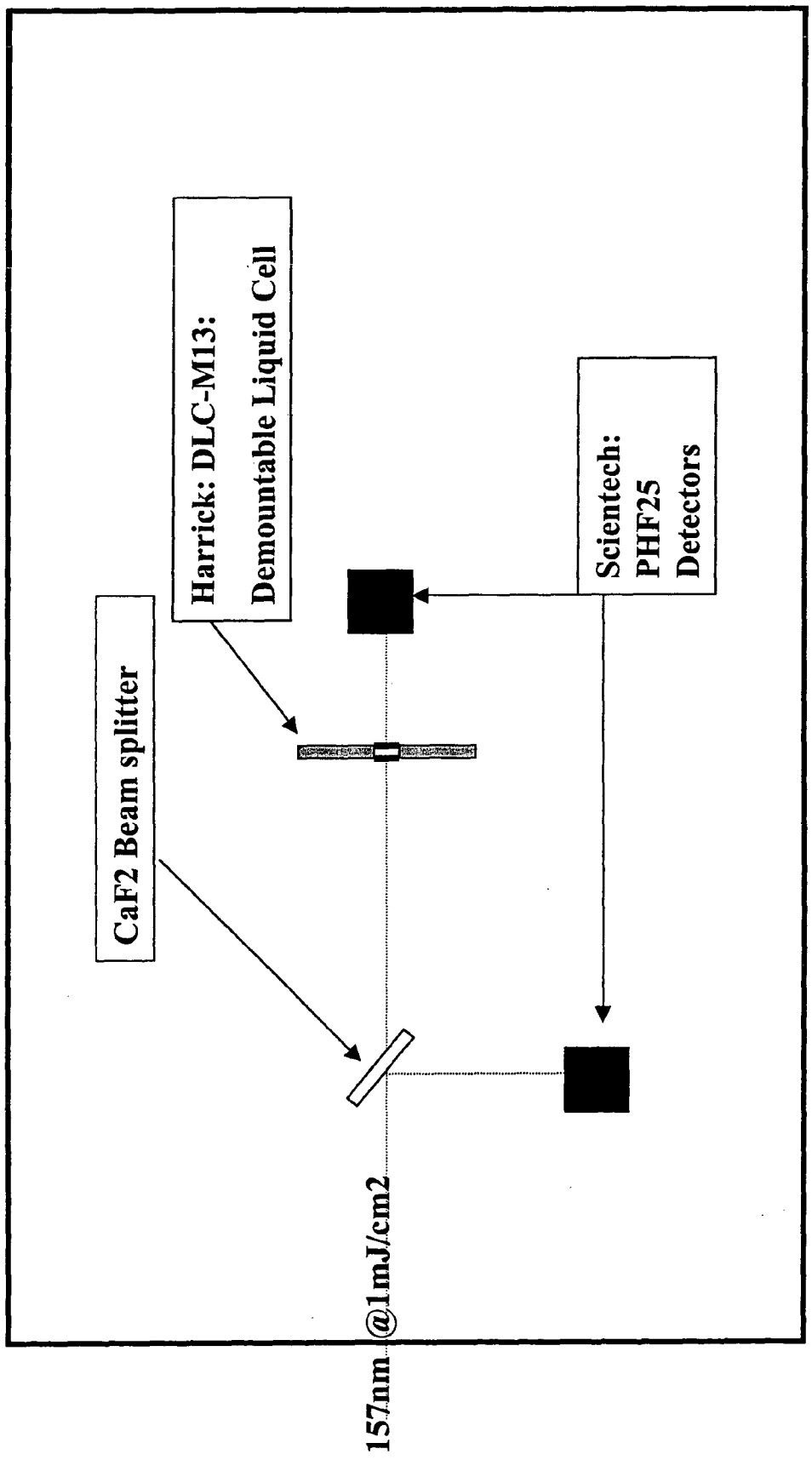
FIG. 2 shows the light path involved in the 157 nm laser irradiation of a specimen.

The present invention is directed to transparent fluorinated organic materials which have been found to be particularly well-suited for employment in VUV photolithography. While broadly directed to applications in the wavelength range of 140 to 260 nm, the two wavelengths of primary interest at the present state of technological development are at 157 nm and 193 nm. 157 nm electromagnetic radiation, by virtue of its shorter wavelength, represents a more severe condition than does 193 nm.

While the methods and principles taught herein are applicable to transparent fluorinated organic materials suitable for both 157 nm and 193 nm photolithography, one or another of the specific compositions comprehended herein may be better suited for use at one or the other of 157 nm or 193 nm wavelengths. In the course of the discussion following hereinbelow, the term "157 nm or 193 nm" will be used throughout to indicate that the materials comprehended may be well suited to use at either one of the wavelengths, or may be useful at both wavelengths. Thus, for the purpose of the present invention, the term "or" should not be taken as limiting to only 157 nm or only 193 nm, but may also be taken to mean "or both" as well.

In the practice of the present invention certain compositions have been found to exhibit good transparency at 157 nm, 193 nm, or both. These compositions comprise compounds selected from the group consisting of:

i) cyclic, linear, or branched hydrofluorocarbons having 2 to 10 carbon atoms in which there are more fluorines than hydrogen, no runs of adjacent C—H bonds longer than two (CH—CH), no runs of adjacent C—F bonds longer than 6 (CF—CF—CF—CF—CF—CF), and no —CH$_2$CH$_3$ radicals;

ii) X—R$_f^a$[OR$_f^b$]nOR$_f^c$Y wherein X and Y can be hydrogen or fluorine and R$_f^a$, R$_f^b$, and R$_f^c$ are 1 to 3 carbon fluorocarbon radicals, linear or branched in which there are more fluorines than hydrogens, no runs of adjacent C—H bonds longer than two are present, and no sequences with hydrogen on both sides of an ether oxygen (CH—O—CH) are present;

iii) C$_n$F$_{2n-v+2}$H$_v$ wherein n=2 to 10, v<n+1, no runs of adjacent C—H bonds longer than two are present, no runs of adjacent C—F bonds longer than 6 are present, and no CH$_2$CH$_3$ radicals are present;

iv) C$_n$F$_{2n+1}$CFHCFHC$_m$F$_{2m+1}$ where n equals 1 to 4; and m equals 1 to 4;

v) CF$_3$CH$_2$CF$_2$CH$_3$;

vi) F[CF(CF$_3$)CF$_2$O]$_n$CFHCF$_3$ where n=1 to 5;

vii) $F[CF(CF_3)CF_2O]_nCF_2CF_3$ where n=1 to 5;
viii) $HCF_2(OCF_2)_n(OCF_2CF_2)_mOCF_2H$ where n+m=1 to 8;
ix) cyclic, linear, or branched hydrofluorocarbon amines and ether-amines in which there are more fluorines than hydrogens, no runs of hydrogen longer than two (CH—CH), no runs of adjacent C—F bonds longer than 6 (CF—CF—CF—CF—CF—CF), and no C—H bonds immediately adjacent to either nitrogen or oxygen; and,
x) $XR_f^a(OR_f^b)w(OR_f^c)_x(OR_f^d)_yOR_f^eY$
where X=H or F; $R_f^a$ and $R_f^e$ are independently a linear or branched fluoroalkyl radical of 1 to 3 carbons; $R_f^b$, $R_f^c$, and $R_f^d$ are linear or branched fluoroalkenyl radicals of 1-3 carbons; and w, x, and y=0 to 10 with the proviso that w+x+y>2.

The compounds cited hereinabove which are suitable for use in the present invention are characterized by desirably low absorbance in the region from 140-260 nm. Table 1 shows the measured absorbance at 157 nm for a selection of commercially available compounds which are comprehended among the compositions hereinabove cited.

$$A(\mu m^{-1}) = A/\mu m = \frac{Log_{10}\lfloor T_{substrate}/T_{sample}\rfloor}{t}. \quad \text{Equation 1}$$

To eliminate the effect of multiple reflections in the case of the liquid samples employed herein, absorbance was determined using differing cell spacer thicknesses. The spectral transmission was measured at both cell thicknesses ($t_1$ and $t_2$) and the incremental decrease in transmission ($T_1$ and $T_2$) with the increase in the sample's optical path length provides the optical absorbance/micrometer using Equation 2.

$$A/\mu m = \frac{\log_{10}(T_1) - \log_{10}(T_2)}{t_2 - t_1}. \quad \text{Equation 2}$$

For highly transparent samples it can be useful to report the absorbance in units of inverse centimeters instead of

TABLE 1

Absorbance/Micrometer (A/μm)

| Ex | Commercial Name | Vendor | Chemical Formula | A/μm @ 157 nm |
|---|---|---|---|---|
| 1 | Fluorinert ™ FC-40* | 3M, St. Paul, MN | —$N(CF_2CF_2CF_2CF_3)_3$ | 0.21 |
| 2 | Vertrel ™ XF | DuPont, Fluoroproducts Wilmington, DE | $CF_3CFHCFHCF_2CF_3$ | 0.0026 |
| 5 | H-Galden ® ZT 85 | Ausimont USA, Inc., Thorofare, NJ | $HCF_2O(CF_2O)_n(CF_2CF_2O)_mCF_2H$ | 0.0037 |
| 12 | Solkane ™ 365 mfc | Solvay Fluorides St. Louis, MO | $CF_3CH_2CF_2CH_3$ | 0.0025 |

*Fluorinert ™ FC-40 is a mixture of perfluorinated amines of which $N(CF_2CF_2CF_2CF_3)_3$ is a major component.

Figure 3:
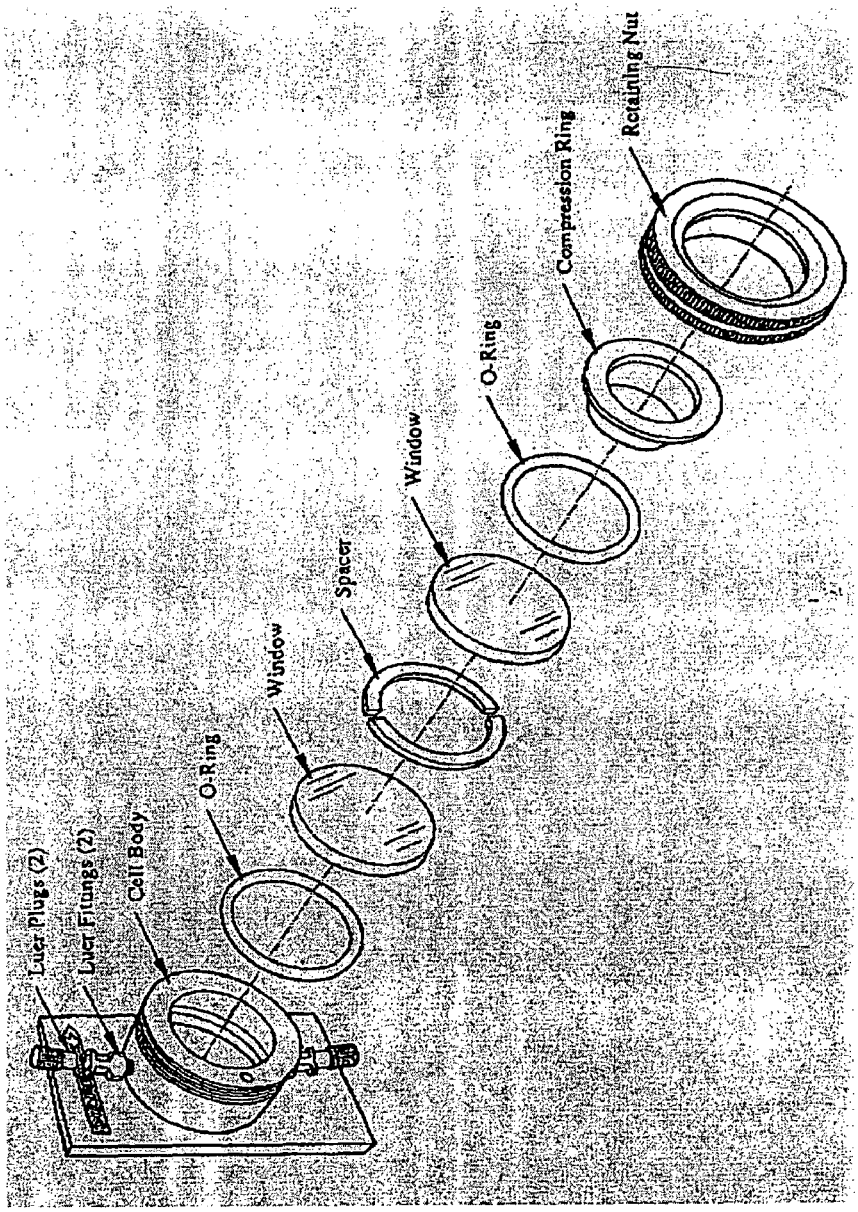
FIG. 3 is a schematic drawing of the Herrick DLC liquid specimen cell, showing the annular spacers, windows and related parts.

The transmission measurements of the fluid samples listed in Table 1 were made using a Harrick Scientific Corp. (Harrick Scientific Corporation 88 Broadway Ossining, N.Y.) Demountable Liquid Cell model DLC-M13 as shown in FIG. 3. The DLC-M13 was mounted in a VUV-Vase model VU-302 spectroscopic ellipsometer, which is capable of performing transmission measurements (J.A. Woolman Co., Inc. Lincoln, Nebr.). The liquid specimen to be tested was held in a cell formed between parallel $CaF_2$ windows by insertion of a Teflon® ring between the windows. Teflon® rings of 6, 25, 100, 500, 920, 2200, 3000 and 4000 micrometer thicknesses were used, providing multiple optical path lengths through aliquots of the same sample. While charging the cell, care was taken to avoid bubbles in the 8 mm diameter window aperture.

The optical absorbance, A ($\mu m^{-1}$), per micrometer of specimen thickness as defined in Equation 1, is defined for purposes herein as the base 10 logarithm of the ratio of the transmission of the $CaF_2$ windows at the test wavelength divided by the transmission at that wavelength of the test sample (windows plus experimental specimen) divided by the thickness (t) of the test specimen—in the case of the experiments reported herein, any of 6, 25, 100, 500, 920, 2200, 3000 and 4000 micrometers, as discussed hereinabove.

inverse microns. There is a factor of 10,000 between the A/cm and A/um, e.g. A/cm=10,000×A/um. Also for highly transparent materials the absorbance method above was generalized to allow for multiple thicknesses. The procedures are discussed below.

We generalize this relative transmission method for absorbance determination from multiple optical path lengths in the sample so as to achieve better accuracy in determining the optical absorbance per centimeter of these materials. We have used up to 5 different optical path lengths, spanning from 6 to 4400 micrometer cell thicknesses. In this case we measure the transmission $T_n$ (in general) as a function of thickness $t_n$ for the cells of various thicknesses.

$T_1(\lambda)=T_0(\lambda)e^{-\alpha(\lambda)t_1}$ $T_2(\lambda)=T_0(\lambda)e^{-\alpha(\lambda)t_2}$ $T_3(\lambda)=T_0(\lambda)e^{-\alpha(\lambda)t_3}$

. . .

$T_n(\lambda)=T_0(\lambda)e^{-\alpha(\lambda)t_n}$

Then taking logarithm of all equations gives ln $T(\lambda)$=ln $T_0(\lambda)-\alpha(\lambda)t_1$ ln $T_2(\lambda)$=ln $T_0(\lambda)-\alpha(\lambda)t_2$ $\ln T_3(\lambda) = \ln T_0(\lambda) - \alpha(\lambda)t_3$

...

$\ln T_n(\lambda) = \ln T_0(\lambda) - \alpha(\lambda)t_n$

This is a set of N equations for the linear system $y_i = ax_i + b$, where $y_i = \ln T_i(\lambda)$, $a \equiv \alpha(\lambda)$, $b \equiv \ln T_0(\lambda)$, and $x_i \equiv t_i$.

We use linear algebra to simultaneously solve this system of linear equations by a least squares method for the absorbance/centimeter of the samples. The solutions can be done both for the case where the errors of measurement for all observations are independent of i, (homoscedastic), the equations are solved by a least-squares method and for the case where the errors of measurement are dependent on i, (heteroscedastic), the equations are solved by a weighted least-squares method.

As an example for the homoscedastic case the equations we solve are:

$$\frac{\partial}{\partial a} \sum (\ln T_i(\lambda) + \alpha(\lambda)t_i - b(\lambda)) = 0$$

$$\frac{\partial}{\partial b} \sum (\ln T_i(\lambda) + \alpha(\lambda)t_i - b(\lambda)) = 0$$

And the solutions are:

$$\alpha(\lambda) = \frac{\sum t_i \sum \ln T_i(\lambda) - N \sum t_i \ln T_i(\lambda)}{N \sum t_i^2 - \sum t_i \sum t_i}$$

$$b(\lambda) = \frac{\sum \ln T_i(\lambda) \sum t_i^2 - \sum t_i \ln T_i(\lambda) \sum t_i}{N \sum t_i^2 - \sum t_i \sum t_i}$$

From this analysis of multiple transmission measurements of the material at multiple cell thicknesses we are able to determine the absorbance/centimeter of the material.

In further investigation it was found that, when irradiated by 157 nm laser radiation at an intensity and for a duration similar to those expected to be encountered in actual commercial practice, the organic compounds suitable for the practice of the present invention in their as-received or as-synthesized condition underwent photochemical darkening (PCD) and bubble formation at a rate which could limit the useful lifetime thereof in practical commercial use. Thus, there is considerable incentive for finding a means for increasing the useful lifetime of organic compounds intended for use in 157 nm or 193 nm photolithography, and for inhibiting the formation of bubbles.

One of skill in the art will appreciate that PCD and bubble formation are highly deleterious to the value in use of the transparent materials employed in photolithography. Photochemical instability at VUV wavelengths may be inherent in the candidate material for use in VUV photolithography, resulting in undesirable levels of PCD and/or bubbles; this is a particular issue at the very high photon energies associated with 157 nm irradiation. However, one of skill in the art will appreciate that even small levels of contaminants—some of which may be highly absorbing at the wavelength of interest—may exhibit the photochemical activity which leads to PCD and bubbles. It is thus of considerable interest to determine whether extraction of potential sources of photochemical activity may result in an improvement to PCD, bubble formation, or both.

Two particularly suspect photochemically active species at the short wavelengths of interest herein are oxygen and moisture because of their ubiquity in nature.

Upon further investigation it is found that the preferred organic compounds of the invention as received or as synthesized, exhibit a moisture content generally above 20 ppm and usually above 50 ppm and often above 200 ppm; and an oxygen content generally in the range 90 ppm. It is further found that when a means for extracting moisture from a liquid is applied to the organic compounds preferred for the practice of the present invention that the moisture content is readily reduced to below 20 ppm, preferably below 15 ppm, more preferably below 10 ppm, and occasionally and most preferably below 1 ppm. It is found surprisingly that the PCD rate at 157 nm and 193 nm of the thus prepared reduced-moisture compound is reduced many fold over the starting material.

It is also found that treatment of the fluorinated organic compounds suitable for the practice of the invention with a means effective for reducing oxygen concentration is also effective in reducing PCD as well as bubble formation.

In a preferred embodiment of the present invention there is provided a composition suitable for use in 157 nm or 193 nm lithography which exhibits an extended useful lifetime by virtue of a reduced PCD rate and reduced bubble formation over the as-received fluorinated organic compounds suitable for the practice of the present invention, said composition comprising less than 20 parts per million of water, less than 90 ppm oxygen, and one or more compounds selected from the group consisting of:

i) cyclic, linear, or branched hydrofluorocarbons having 2 to 10 carbon atoms in which there are more fluorines than hydrogen, no runs of adjacent C—H bonds longer than two (CH—CH), no runs of adjacent C—F bonds longer than 6 (CF—CF—CF—CF—CF—CF), and no —CH$_2$CH$_3$ radicals;

ii) X—R$_f^a$[OR$_f^b$]nOR$_f^c$Y wherein X and Y can be hydrogen or fluorine and R$_f^a$, R$_f^b$, and R$_f^c$ are 1 to 3 carbon fluorocarbon radicals, linear or branched in which there are more fluorines than hydrogens, no runs of adjacent C—H bonds longer than two are present, and no sequences with hydrogen on both sides of an ether oxygen (CH—O—CH) are present;

iii) C$_n$F$_{2n-v+2}$H$_v$ wherein n=2 to 10, v<n=1, no runs of adjacent C—H bonds longer than two are present, no runs of adjacent C—F bonds longer than 6 are present, and no CH$_2$CH$_3$ radicals are present;

iv) C$_n$F$_{2n+1}$CFHCFHC$_m$F$_{2m+1}$ where n equals 1 to 4; and m equals 1 to 4;

v) CF$_3$CH$_2$CF$_2$CH$_3$;

vi) F[CF(CF$_3$)CF$_2$O]$_n$CFHCF$_3$ where n=1 to 5;

vii) F[CF(CF$_3$)CF$_2$O]$_n$CF$_2$CF$_3$ where n=1 to 5;

viii) HCF$_2$(OCF$_2$)$_n$(OCF$_2$CF$_2$)$_m$OCF$_2$H where n+m=1 to 8;

ix) cyclic, linear, or branched and hydrofluorocarbon amines, and ether-amines in which there are more fluorines than hydrogens, no runs of hydrogen longer than two (CH—CH), no runs of adjacent C—F bonds longer than 6 (CF—CF—CF—CF—CF—CF), and no C—H bonds immediately adjacent to either nitrogen or oxygen; and, x) XR$_f^a$(OR$_f^b$)w(OR$_f^c$)$_x$(OR$_f^d$)$_y$OR$_f^e$Y where X==H or F, each R$_f$ is independently a linear or branched fluoroalkyl radical of 1 to 3 carbons, and w, x, and y=0 to 10 with the proviso that w+x+y>2.

Preferably the composition of the invention comprises one or more compounds selected from the group consisting of perfluoro-N-methymorpholine, $C_nF_{2n+1}$ CFHCFHC$_m$F$_{2m+1}$ where n equals 1 to 4; and m equals 1 to 4 and HCF$_2$(OCF$_2$)$_n$(OCF$_2$CF$_2$)$_m$OCF$_2$H where n+m=1 to 8, said composition having a moisture content of less than 20 ppm and an oxygen content of less than 90 ppm. More preferably, the composition of the invention comprises, perfluoro-N-methymorpholine, $CF_3$CFHCFHCF$_2$CF$_3$, $CF_3$CH$_2$CF$_2$CH$_3$ or HCF$_2$O(CF$_2$O)$_n$(CF$_2$CF$_2$O)$_m$CF$_2$H where n+m=2 to 6, or a mixture thereof, said composition having a moisture content of less than 20 ppm and an oxygen content of less than 90 ppm. The organic compound of the invention is preferably a liquid.

Fluoroethers, including fluoroetheramines, are highly preferred for the practice of the invention. In the preferred embodiments of the instant invention, absorbance/cm of <2, <1 in the most preferred embodiments, at 157 nm is observed. The extraordinarily low ansorbance of these preferred species in the range of 150-200 nm, especially at 157 nm and 193 nm, makes them particularly well-suited for employment as components in VUV applications in optical couplants; optical cements; lenses, beam splitters, diffraction gratings, and other optical elements; optical waveguides; index matching for microscopic inspection procedures; and immersion lithography. In a particularly preferred embodiment, the preferred fluoroethers of the invention are employed as an immersion fluid in immersion lithography according to the teachings of the art, hereinabove cited.

In one aspect, the most preferred embodiments hereof are particularly well-suited for use as "dual wavelength" fluids—that is, they are particularly well-suited to being employed interchangeably at 157 nm and 193 nm, the two most commonly cited wavelengths for photolithographic preparation of electronic or integrated optical circuitry in the VUV.

In one embodiment the preferred fluoroether is a cyclic perfluoroaminoether comprising one or more linear perfluoroalkyl radicals, perfluoroalkenyl radicals, or a combination thereof, said radicals having 1 to 6 carbons. More preferably the cyclic perfluoroaminoether is perfluoro-N-methylmorpholine. Still more preferably, the perfluoro-N-methylmorpholine is characterized by water vapor and oxygen concentrations each of less than 5 ppm by weight of the fluoroether. Most preferably, the perfluoro-N-methylmorpholine is characterized by water vapor and oxygen concentrations each of less than 1 ppm by weight of the fluoroether. Absorbance/cm of the most preferred embodiments hereof is <2 at 157 nm.

In a further embodiment the preferred fluoroether is an acyclic perfluoroether having linear or branched perfluoroalkyl radicals, perfluoroalkenyl radicals, or a combination thereof, said radicals having 1 to 6 carbons. More preferably the acyclic perfluoroether is $CF_3(CF_2)_2OCF(CF_3)$ $CF_2OCF_2CF_3$, $CF_3O(CF_2O)_nCF_3$ where n is 3 to 5, or $CF_3O(CF_2O)_xCF_2CF_2O(CF_2O)_yCF_3$ where x and y independently are 2 or 3. Still more preferably, the acyclic perfluoroether is characterized by water vapor and oxygen concentrations each of less than 5 ppm by weight of the fluoroether. Most preferably, the acyclic perfluoroether is characterized by water vapor and oxygen concentrations each of less than 1 ppm by weight of the fluoroether. Absorbance/cm of the most preferred embodiments hereof is <1 at 157 nm.

In a further embodiment the preferred fluoroether is an acyclic hydrofluorocarbonfluoroether having linear or branched perfluoroalkyl radicals, perfluoroalkenyl radicals, or a combination thereof, said radicals having 1 to 6 carbons and wherein said acyclic hydrofluorocarbonfluoroether there are no geminal or adjacent hydrogens. More preferably, the acyclic hydrofluorocarbonfluoroether is $CF_3CF_2CF_2OCF$ $(CF_3)CF_2OCFHCF_3$ or $CF_3O(CF_2O)_nCF_2H$ wherein n=3 to 5. Still more preferably, the acyclic hydrofluorocarbonfluoroether is characterized by water vapor and oxygen concentrations <5 ppm by weight of the fluoroether. Most preferably the acyclic hydrofluorocarbonfluoroether is characterized by water vapor and oxygen concentrations of <1 ppm by weight of the fluoroether. The 157 nm absorbance/cm of the most preferred embodiment is <2.

In another embodiment of the present invention is provided a process for the preparation of the composition of the invention. The liquid organic compounds preferred for the practice of the present invention are well-known known in the art, and may be prepared according to the methods hereinabove described with reference to the published methods therefor. In the process of the invention the liquid organic compound, or organic liquid, of the invention in its "as received" or "as synthesized" state is subject to one or more means for extracting photochemically active species. Methods known in the art for performing extractions of particular types of contaminants are suitable for the practice of the present invention, but care must be taken that these methods are executed under very clean conditions to avoid further contamination, thus substituting one problem for another.

In one embodiment of the process of the invention, the photochemically active species is moisture. Any means for extracting moisture as is known in the art is acceptable for the practice of the present invention. Suitable means include but are not limited to heating in an oven under vacuum, or under a desiccated purge gas, or both; heating in a recirculating air oven having desiccant beds; refluxing in the presence of a desiccated purge gas, sparging with a purge gas, preferably an inert gas such as nitrogen or argon; exposing said liquid to a desiccated atmosphere at room temperature or below; contacting said liquid with a desiccant such as molecular sieves; vaporizing said liquid and passing over a desiccant such as molecular sieves, followed by condensation; or contacting said liquid with chemical desiccants such as isocyanates and fractionally distilling. In the case of contacting said fluorinated organic compound with a desiccant it will normally be necessary to add a separation step upon completion of the extraction step. One of skill in the art will appreciate that not all methods of drying will be suitable for every compound suitable for the practice of the present invention. For example, if the organic liquid is flammable, a heating method may be less desirable than some other means. The inventors hereof do not contemplate any limitations on the methods of drying which may be employed to achieve the desired state of dryness with the proviso that the method employed not introduce more undesirable contamination than it removes, that the method not cause significant degradation of the compound being purified, and that the method be safely executed. Thus any method known to one of skill in the art for extracting moisture from organic liquids is suitable.

Preferred for the practice of the invention is to contact said preferred organic liquid with molecular sieves followed by filtration to separate the thereby desiccated organic liquid from said molecular sieves. Types 3A, 4A, and 5A molecular sieves are preferred because their cavities are of a size that favor the selective absorption of water from organic vapors and fluids.

In a further embodiment, the photochemically active species is oxygen. It will be understood by one of skill in the art that oxygen contamination represents an additional source of photochemical instability at the high energies of VUV radiation. Oxygen is of course closely associated with numerous degradation mechanisms in many materials from organics to metals. The technique of sparging with an inert gas, preferably nitrogen or argon, is found to be an effective means for removing oxygen from the compositions of the invention. Other methods suitable for removing oxygen include but are not limited to heating in an oven under vacuum, or under an oxygen free purge gas, contacting with an oxygen scavenger, repeated cycles of freezing, pulling a high vacuum and thawing, or vacuum distillation are all effective means for extracting oxygen from the fluorinated organic compounds suitable for use is the present invention. The inventors hereof do not contemplate any limitations on the methods of extracting oxygen which may be employed to achieve the desired oxygen concentration with the proviso that the method employed not introduce more undesirable contamination than it removes, that the method not cause significant degradation of the compound being purified, and that the method be safely executed. Thus any method known to one of skill in the art for extracting oxygen from organic liquids is suitable. Preferred is the method of fractional distillation by freeze-thaw cycles under vacuum.

In the most preferred embodiment of the process of the invention the fluorinated organic compound is subject to extraction of photochemically active species, particularly oxygen and moisture, by freeze-thaw cycles under vacuum in combination with contacting the organic compound of the invention with molecular sieves.

Sparging is also an effective method for practicing the process of the invention, particularly for the removal of oxygen. One method for sparging found effective in the practice of the invention is as follows: A glove box is supplied with dry, low-oxygen-content nitrogen such as 99.998% or better nitrogen sold as a cylinder gas by Matheson or by the boil-off of liquid nitrogen. A liquid aliquot of about 10 ml is placed in a 20 ml glass scintillation vial. The sample is transferred into the nitrogen purged dry box. The vial is secured flat on the work surface, the plastic cap is removed from the vial, a disposable glass pipette lowered into the solvent and then nitrogen delivered via the pipette from the same dry, low-oxygen source as the glove box. Flow rate is adjusted to maintain vigorous bubbling of solvent short of causing the solvent to splash out of the vial. Vigorous sparging is continued for 30-60 seconds, long enough to significantly decrease oxygen content and possibly water content without major loss of solvent to evaporation.

A particularly preferred method for removing oxygen and water vapor is the bulb-to-bulb distillation process. The apparatus can be constructed from any material that does not add absorbing impurities to the fluid to be purified. For small samples, it is convenient to use glassware sealed with greaseless o-rings that never contact the specimen. The method combines freeze-thaw cycles effective in removing absorbed gases such as oxygen with vapor phase passage of the fluid through an absorbing bed containing one or more materials that physically or chemically remove impurities. Examples of bed materials include 3A molecular sieves for the physical absorption of water, activated carbon for the physical absorption of organic impurities, and chemically reactive beds such as Matheson Tri-Gas's NanocheM™ purifiers which can be used to remove water, oxygen, and some organic impurities down to ppb levels. An inert such as a perfluoroether can be cleaned up with the Nanochem™ purifiers but more reactive fluids such as 1,1,1,3,3-pentafluorobutane would likely be hazardous. A preferred method for removing both water and oxygen is thus bulb-to-bulb distillation through a bed of 3A molecular sieves (see Example 13).

For the purpose of the present invention, the terms "desiccated" as in "desiccated atmosphere" or "desiccated purge gas" means simply that the atmosphere or purge gas is sufficiently low in moisture content that it can function effectively to extract moisture from the preferred organic liquid of the invention. Preferably, a desiccated purge gas or desiccated atmosphere and the like will have actually been previously subject to an actual drying step prior to its use for extraction of moisture according to the present invention.

One of skill in the art will appreciate that while in a preferred embodiment, both oxygen and moisture are extracted from the fluorinated organic compound herein, extraction of either one but not both is also advantageous. In the practice of the present invention, extraction of any one photochemically active species will be beneficial whether or not any other photochemically active species which may be present is extracted or not. Thus, the inventors hereof contemplate embodiments wherein the moisture content is below 20 ppm, or the oxygen content is below 90 ppm, but wherein moisture and oxygen are not both within the desired range of concentration. These embodiments are less preferred.

It has been found in the practice of the present invention that in the case of the most highly transparent embodiments of the present invention the inherent high transparency thereof cannot be fully realized unless they are highly purified of organic by-products of their production as well as of water and oxygen.

In regard to the organic contaminants therein, it will be understood by one of skill in the art that while 100% purity is a highly desirable situation, it is not achievable in real terms. The compositions of the present invention may be brought to high purity by conventional methods such as distillation in clean equipment. Because certain organic impurities such as but not limited to acid fluorides and olefins are orders of magnitude more absorbing than an impurity such as perfluoroheptane, any purity specifications must be established for each contaminant compound and its source. By way of further example, the most preferred compositions of the invention may tolerate a percent or two of perfluoroheptane, which is not highly absorbing in the wavelength region of interest, or an even higher percentage of perfluorobutane which is quite transparent though of high vapor pressure and low refractive index. On the other hand, it may tolerate only perhaps 0.1% of much more highly absorbing contaminants such as chlorinated fluorocarbons, olefins, including fluoroolefins, and carbonyls, including fluorocarbonyls.

In the practice of the present invention it is found useful to analyze the as received or as-synthesized compositions by a combination of gas chromatography and mass-spectroscopy (GC-MS) to determine what contaminants are present, and, in combination with NMR, whether further purification is necessary. If it is desired to further purify the as-received or as-synthesized chemicals, several methods known in the art may be practiced. These include fractional distillation, zone refining, absorption by carbon, and use of chemically reactive beds such as Matheson Tri-Gas's NanocheM™ purifiers This invention further includes a process for forming an optical image on a substrate, the process comprising:

radiating electromagnetic radiation from a source capable of radiating electromagnetic radiation in the range of 140-260 nm;

receiving said radiation on a target disposed to receive at least a portion of said radiation; and causing at least a portion of said radiation to traverse one or more optically transparent compositions disposed between said radiation source and said target, at least one of said optically transparent compositions comprising a composition comprising less than 20 parts per million of water, less than 90 parts per million of oxygen, and one or more compounds selected from the group consisting of:

i) cyclic, linear, or branched hydrofluorocarbons having 2 to 10 carbon atoms in which there are more fluorines than hydrogen, no runs of adjacent C—H bonds longer than two (CH—CH), no runs of adjacent C—F bonds longer than 6 (CF—CF—CF—CF—CF—CF), and no —$CH_2CH_3$ radicals;

ii) X—$R_f^a$[OR$_f^b$]nOR$_f^c$Y wherein X and Y can be hydrogen or fluorine and $R_f^a$, $R_b^f$, and $R_f^c$ are 1 to 3 carbon fluorocarbon radicals, linear or branched in which there are more fluorines than hydrogens, no runs of adjacent C—H bonds longer than two are present, and no $CH_2CH_3$ radicals are present;

and no sequences with hydrogen on both sides of an ether oxygen (CH—O—CH) are present;

iii) $C_nF_{2n-y+2}H_y$ wherein n=2 to 10, v<n+1, no runs of adjacent C—H bonds longer than two are present, no runs of adjacent C—F bonds longer than 6 are present, and no $CH_2CH_3$ radicals are present;

iv) $C_nF_{2n+1}CFHCFHC_mF_{2m+1}$ where n equals 1 to 4; and m equals 1 to 4;

v) $CF_3CH_2CF_2CH_3$;

vi) F[CF(CF$_3$)CF$_2$O]$_n$CFHCF$_3$ where n 1 to 5;

vii) F[CF(CF$_3$)CF$_2$O]$_n$CF$_2$CF$_3$ where n 1 to 5;

viii) HCF$_2$(OCF$_2$)$_n$(OCF$_2$CF$_2$)$_m$OCF$_2$H where n+m=1 to 8;

ix) cyclic, linear, or branched hydrofluorocarbon amines and ether-amines in which there are more fluorines than hydrogens, no runs of hydrogen longer than two (CH—CH), no runs of adjacent C—F bonds longer than 6 (CF—CF—CF—CF—CF—CF), and no C—H bonds immediately adjacent to either nitrogen or oxygen; and, x) XR$_f^a$(OR$_f^b$)w(OR$_f^c$)$_x$(OR$_f^d$)$_y$OR$_f^e$Y where X=H or F; $R_f^a$ and $R_f^e$ are independently a linear or branched fluoroalkyl radical of 1 to 3 carbons; $R_f^b$, $R_f^c$, and $R_f^d$ are linear or branched fluoroalkenyl radicals of 1-3 carbons; and w, x, and y=0 to 10 with the proviso that w+x+y>2.

Preferably said composition disposed between said light source and said target comprises one or more compounds selected from the group consisting of perfluoro-N-methymorpholine, $C_nF_{2n+1}$CFHCFHC$_m$F$_{2m+1}$ where n equals 1 to 4; and m equals 1 to 4 and HCF$_2$(OCF$_2$)$_n$(OCF$_2$CF$_2$)$_m$OCF$_2$H where n+m=1 to 8, said composition having a moisture content of less than 20 ppm, and oxygen concentration of less than 90 ppm. More preferably, said composition disposed between said light source and said target comprises perfluoro-N-methymorpholine, CF$_3$CFHCFHCF$_2$CF$_3$, CF3CH2CF2CH3 or HCF$_2$O (CF$_2$O)$_n$ (CF$_2$CF$_2$O)$_m$CF$_2$H where n+m=2 to 6, or a mixture thereof, said composition having a moisture content of less than 20 ppm. The organic compound of the invention is preferably a liquid.

It is expected that linear perfluoropolyethers of the structure X—$R_f^a$[OR$_f^b$]$_n$OR$_f^c$Y will show high durability to UV radiation as molecular weights increase, the upper practical limit likely being inconveniently high viscosity. This would include F[CF(CF$_3$)CF$_2$O]$_n$CFHCF$_3$ up to n=~100, F[CF(CF)$_3$CF$_2$O]$_n$CF$_2$CF$_3$ up to n=~100, HCF$_2$(OCF$_2$)$_n$(OCF$_2$CF$_2$)$_m$OCF$_2$H up to n+m=~100, and FCF$_2$(OCF$_2$)$_n$(OCF$_2$CF$_2$)$_m$OCF$_2$F up to n+m=~100.

Most preferably the composition disposed between said light source and said target comprises fluoroethers, including fluoroetheramines.

In one embodiment the preferred fluoroether is a cyclic perfluoroaminoether comprising one or more linear perfluoroalkyl radicals, perfluoroalkenyl radicals, or a combination thereof, said radicals having 1 to 6 carbons. More preferably the cyclic perfluoroaminoether is perfluoro-N-methylmorpholine. Still more preferably, the perfluoro-N-methylmorpholine is characterized by water vapor and oxygen concentrations each of less than 5 ppm by weight of the fluoroether. Most preferably, the perfluoro-N-methylmorpholine is characterized by water vapor and oxygen concentrations each of less than 1 ppm by weight of the fluoroether.

In a further embodiment the preferred fluoroether is an acyclic perfluoroether having linear or branched perfluoroalkyl radicals, perfluoroalkenyl radicals, or a combination thereof, said radicals having 1 to 6 carbons. More preferably the acyclic perfluoroether is CF$_3$(CF$_2$)$_2$OCF(CF$_3$) CF$_2$OCF$_2$CF$_3$, CF$_3$O(CF$_2$O)$_n$CF$_3$ where n is 3 to CF$_3$O (CF$_2$O)$_x$CF$_2$CF$_2$O(CF$_2$O)$_y$CF$_3$ where x and y independently are 2 or 3. Still more preferably, the acyclic perfluoroether is characterized by water vapor and oxygen concentrations each of less than 5 ppm by weight of the fluoroether. Most preferably, the acyclic perfluoroether is characterized by water vapor and oxygen concentrations each of less than 1 ppm by weight of the fluoroether.

In a further embodiment the preferred fluoroether is an acyclic hydrofluorocarbonfluoroether having linear or branched perfluoroalkyl radicals, perfluoroalkenyl radicals, or a combination thereof, said radicals having 1 to 6 carbons. and wherein said acyclic hydrofluorocarbonfluoroether there are no geminal or adjacent hydrogens. More preferably, the acyclic hydrofluorocarbonfluoroether is CF$_3$CF$_2$CF$_2$OCF (CF$_3$)CF$_2$OCFHCF$_3$ and CF$_3$O(CF$_2$O)$_n$CF$_2$H wherein n=3 to 5. Still more preferably, the acyclic hydrofluorocarbonfluoroether is characterized by water vapor and oxygen concentrations <5 ppm by weight of the fluoroether. Most preferably the acyclic hydrofluorocarbonfluoroether is characterized by water vapor and oxygen concentrations of <1 ppm by weight of the fluoroether.

In one embodiment of the photolithographic process of the invention, 157 nm radiation from a $F_2$ excimer laser transmitted through a photomask, typically comprising a chrome metal circuit patterned on glass by electron beam imaging forms an image of the circuit pattern on a photoresist. Various materials for photoresist compositions have been described in *Introduction to Microlithography. Second Edition* by L. F. Thompson, C. G. Willson, and M. J. Bowden, American Chemical Society, Washington, D.C., 1994.

The composition of the present invention may be employed in any number of ways which will cause it to become disposed between the light source and the target.

In a preferred embodiment of the present invention the compositions of the invention are present in a pellicle employed in 157 nm photolithography. In a second preferred embodiment of the present invention, the compositions of the invention are present in a pellicle employed in 193 nm photolithography. A pellicle is a free standing polymer film, typically 0.8 micrometers in thickness which is placed over a photomask or other template pattern to keep particulate contamination out of the photomask object plane in order to reduce the defect level in the resulting image. The pellicle film must have high transparency at the lithographic wavelength for image formation and must exhibit a reasonable lifetime under repeated exposures to the lithographic irradiation. The term "reasonable" is of course a relative term determined by the economics of the particular application.

Fluorocarbon polymers are preferred for use in forming pellicles for use at VUV wavelengths. One method by which pellicles may be fabricated is by spin-coating from solution according to methods well-known in the art. As spun, the pellicle film may contain up to 10 wt % residual solvent which is not readily removed and may even be desirable in order to provide some plasticization to the film. It will be appreciated by one of skill in the art that a relatively small concentration of a solvent which lacks transparency at the lithographic wavelength may have a catastrophic effect on the transparency of the pellicle. Similarly, if the residual solvent exhibits photochemical instability, the durability of the pellicle film will be reduced. The compositions of the present invention exhibit a combination of high transparency and high radiation durability which makes them particularly useful as solvents for the preparation of pellicles for use in 157 nm or 193 nm photolithography.

Similar considerations and benefits will accrue to the employment of the compositions of the invention as solvents in the preparation of a photoresist layer by spin coating. The reason for this is that residual solvent is always left behind when spin coating resist films. If this residual solvent absorbs light strongly, light absorbtion at the top and bottom of the resist film become unequal enough to result in poor pattern development. Furthermore, if the residual solvent is photochemically unstable, the photoresist layer may exhibit defects upon exposure to VUV radiation. The fluids of this invention are highly attractive spin coating solvents because they will not noticeably increase absorption in photoresist layers when left behind as a residue.

In a further preferred embodiment, the composition of the present invention is employed in immersion photolithography as described by Switkes et al, op. cit. In immersion photolithography at least either the source or the target is immersed in the optically transparent composition of the invention. Preferably, both source and target are therein immersed. Among the requirements for the immersion medium that Switkes discusses are that it be transparent enough to allow a working distance of 10's of micrometers and that it have high radiation durability under 157 nm or 193 nm irradiation. The combination of high transparency and high radiation durability of the compositions of the present invention makes them particularly well-suited for immersion lithography applications at 157 nm or 193 nm wavelengths.

In still further embodiments, the compositions of the present invention are useful in the fabrication of sheets, layers, coatings, and films used in lenses, light guides, anti-reflective coatings and layers, windows, protective coatings, and glues suitable for use in 157 nm or 193 nm photolithography.

The compositions of the present invention are particularly useful in the formation of anti-reflection coatings and optical adhesives by virtue of low absorbance at 157 nm or 193 nm. The composition of the invention can be used to reduce the light reflected from the surface of a transparent substrate of a relatively higher index of refraction. This decrease in the reflected light, leads to a concomitant increase in the light transmitted through the transparent substrate material.

The compositions of the present invention are useful in many applications, particularly those that tolerate liquids, for example for optical couplants, liquid lenses, immersion fluids, and in the manufacture of transmissive optical elements, such as optical waveguides, lenses and beam splitters, for use in the vacuum UV region. Other uses are for components of other, more solid things, such as solvents for photoresists, pellicle films, optical cements, for the polymers in polymer waveguide and like uses. These liquids can also be used for inspection media for immersion inspection of patterned objects, such as semiconductor wafers, where the benefit of slightly reduced wavelength will produce higher resolution imaging for small size defects.

These compositions may also be used as elements in a compound lens designed to reduce chromatic aberrations. At present only $CaF_2$ and possibly hydroxyl free silica are viewed as having sufficient transparency at 157 nm or 193 nm to be used in transmissive focussing elements. It is also commonly known (e.g, see R. Kingslake, Academic Press, Inc., 1978, Lens Design Fundamentals, p. 77) that by using a second material of different refractive index and dispersion, an achromatic lens can be created. By using the composition of the present invention in conjunction with $CaF_2$, it is expected that an achromatic lens can be constructed from this and other similar materials described in this application.

In still another embodiment, the compositions of the present invention may be employed as index matching fluids for inspection of fine parts such as circuit elements in integrated circuits.

The extraction methods herein described, particularly for moisture and oxygen, are particularly useful for preparing fluorinated organic liquids for use in immersion lithography. The extraction methods herein taught are not limited to the specific compositions herein disclosed, but may be applied with excellent results to any fluorinated organic liquid contemplated for use as the immersion medium for immersion lithography in the VUV. Thus, even less preferred fluorinated organic compositions than those specifically disclosed herein, such as those exhibiting absorbance/micrometer up to 5, will exhibit improvements in PCD and bubble formation when extracted according to the process hereinabove described. By application of the methods herein, the moisture content of any such liquid contemplated can be reduced to below 20 ppm, and the oxygen content, to below 90 ppm.

It is found in the practice of the present invention that in some cases the measured PCD rate is dependent upon the dose received, with the highest rate being recorded for low initial doses. It is further found in the practice of the invention that PCD does not proceed indefinitely until the transparency has virtually disappeared. In some cases instead darkening occurs at a decreasing rate with increasing dose until an asymptote still at high transmission levels is approached and no further darkening is observed with increasing dose. It is further found in the practice of the invention that at least in certain cases, a cessation of exposure to 157 nm irradiation after the asymptotic level is reached results in further darkening. However, upon re-exposure to 157 nm radiation the degree of darkening is actually reduced and again the asymptotic level of transparency is re-achieved.

These phenomena are illustrated in certain specific embodiments of the invention hereinbelow.

The present invention is further described but not limited to the following specific embodiments.

EXAMPLES

For the purpose of the examples hereinbelow, the absorbance of a test specimen was determined prior to laser irradiation, and then again after laser irradiation at 157 nm, using the methods and equipment described hereinabove with the exception that only the 6 μm or 25 μm cell was used, as specified in Tables 2 and 3. The dose of 157 nm radiation was determined according to the power output of the laser and the duration of the exposure. The difference between the two absorption readings was divided by the dosage received to give a parameter defined for the purposes herein to be the linear PCD rate. For the purpose of comparing one specimen to another, the linear PCD rate was then employed. This is referred to herein as the "10% PCD" dosage.

To calculate the PCD rate, we calculated the induced absorbance/um divided by the given irradiation dose (D). These were calculated from Equation 3 where $T_1$ was the initial transmission for a cell of thickness t and $T_2$ was the final transmission after a dose D.

$$A_i/D = \frac{\log_{10}(T_i) - \log_{10}(T_2)}{t} / D. \qquad \text{Equation 3}$$

The 10% PCD Lifetime, in units of Joules/cm² dose of 157 nm radiation was calculated from the ratio of the induced absorption necessary to produce a transmission drop, ΔT, of 10% for a sample of thickness t=0.8 micrometers, as given by Equation 4. An increase in the 10% PCD lifetime corresponded to increased radiation durability.

$$\text{Lifetime} = \frac{A_i}{PCD \text{ rate}} = \frac{\log_{10}(T_{init}/(T_{init} - \Delta T))}{t \; PCD \text{ rate}}. \qquad \text{Equation 4}$$

Water concentration was determined according to the Karl Fischer method commonly employed in the art. The effect of drying over molecular sieves of the preferred compositions of the invention is indicated in Table 4.

Laser irradiation at 157 nm was accomplished inside a nitrogen purged dry-box using an Optex $F_2$ excimer laser made by Lambda Physik (Lambda Physik USA, Inc, Fort Lauderdale, Fla.). In practice the DCL cell hereinabove described was simply moved from the ellipsometer described hereinabove to a holder in the dry box putting the test sample into the path of the laser. The laser pulse rate was 50 hz, putting out 1 mJ/cm²/pulse energy density or 3 Joules/cm²/minute. All doses reported here are Joules per cm² area irradiated. The reported doses are corrected for the losses associated with the $CaF_2$ windows so that the doses represent the actual dose incident upon the sample itself, not the total dose incident upon the measurement cell.

As in all experimental measurements, the accuracy of the measured values was a function of the sample and measurement apparatus. The inherent sensitivity of spectral transmission and absorbance measurements was affected by the optical path length of the sample, and the transmission drop that occurred as light passed through the sample in the measurement. As the transmission drop decreased, the accuracy of the absorbance measurement decreased. A transmission difference of ~0.1% was near the limit of the measurement method. In such a case, a thicker sample, with a longer path length, was required to keep the measured transmission drop larger than the instrument's sensitivity.

TABLE 2

10% PCD Lifetime and moisture content of as-received organic compounds

| Ex. | Solvent | Thickness um | Initial Dose (J/cm²) | 10% PCD Lifetime (J/cm²) | Moisture Content (as received) ppm |
|---|---|---|---|---|---|
| Comp. Ex 2 | $CF_3CFHCFHCF_2CF_3$ Vertrel ™ XF | 6 | 3 | 9.9 | 72 |
| Comp. Ex. 3 | $CF_3CFHCFHCF_2CF_3$ Vertrel ™ XF | 6 | 6 | 52.7 | 72 |
| Comp. Ex. 4 | $CF_3CFHCFHCF_2CF_3$ Vertrel ™ XF | 6 | 20 | 47.5 | 72 |
| Comp. Ex. 5 | $HCF_2O(CF_2O)_n$ $(CF_2CF_2O)_mCF_2H$ H-Galden ® ZT 85 | 25 | 15 | Bubble | 257 |
| Comp. Ex. 6 | $HCF_2O(CF_2O)_n$ $(CF_2CF_2O)_mCF_2H$ H-Galden ® ZT 85 | 25 | 30 | Bubble | 257 |
| Comp. Ex. 7 | $HCF_2O(CF_2O)_n$ $(CF_2CF_2O)_mCF_2H$ H-Galden ® ZT 85 | 25 | 15 | Bubble | 257 |

For the purpose of the present invention, the experimental comparisons made herein were determined for the initial PCD rate measured in each particular case. The initial dosage was not always the same.

Harrick Liquid Cell Procedures

For the purpose of measuring the spectral transmission of fluids as candidates for Immersion Fluids to be used in MicroLithographic Processing, we used a Harrick DLC-M13 demountable liquid cell. The cell had a 8 mm aperture, which included (2) 13 mm diameter×2 mm thick CaF2 windows, o-ring seals, (2) Luer Lock fittings for loading sample, assorted Teflon spacer thick nesses from 6 um to 4000 um. The cell was disassembled for cleaning.

Harrick Cell Cleaning and Assembly Procedure:

Prior to use, and after each sample run, the cell was flushed with Vertrel XF, (as a cleaning solvent), through both Luer Lock fittings using a 1 ml BD glass syringe, then blown dry using clean house nitrogen. The (2) CaF2 windows and the selected thickness Teflon spacers were placed into a 20 ml vial containing Vertrel XF, (capped), then put into an ultrasonic bath for, 30-60 seconds. The CaF2 windows and spacers were removed form the cleaning vial, given a final rub with a Q-tip moistened with Vertrel XF then dried with air from a puffer bulb. The cell was then assembled by placing an o-ring into the internal base of the cell, then placing one of the CaF2 windows into the cell, followed by the Teflon spacers, then the second or top CaF2 window, then putting the top o-ring in on the CaF2, place the compression ring onto this assembly then hand tightened the compression nut onto the cell. The complete cleaning and assembly was done in air, in the lab hood.

Loading the Harrick Cell in Air . . . (Lab Hood)

Using a clean, fully assembled cell, approximately 0.5 ml of the sample liquid was transferred from its container using a clean 1 ml BD glass syringe, the syringe was then Luer Locked into the cell and the plunger was gently pushed up to fill the cell. The cell was filled until the liquid meniscus began to exit the top Luer Lock fitting on the cell. No trapped bubbles were permitted to reside in the cell aperture, then the top Luer Lock fitting was capped with the Teflon plug supplied, and the cell was inverted with the syringe still attached. The syringe was twisted off, the thus exposed fitting was capped with another Teflon plug. The sample so prepared was ready for processing.

Loading the Harrick Cell in Nitrogen . . . (Nitrogen Dry Box)

A cleaned, assembled cell, with Teflon plugs (separate, not inserted), a clean 1 ml BD syringe and the selected sample material were placed into the N2 dry box antichamber. This chamber was continually purged with house nitrogen until the Oxygen meter on the dry box read 10 ppm O2—approximately 30 minutes. The equipment was then transferred into the dry-box proper.

The sample bottle was opened and approximately 0.5 ml of the sample was transferred from its container using a clean 1 ml BD glass syringe, the syringe was Luer Locked into the cell and the syringe plunger gently pushed up to fill the cell. The cell was filled until the liquid meniscus began to exit the top Luer Lock fitting on the cell. No trapped bubbles were permitted to reside in the cell aperture, then the top Luer Lock fitting was capped with the Teflon plug supplied, and the cell was inverted with the syringe still attached. The syringe was twisted off, the thus exposed fitting was capped with another Teflon plug. The sample so prepared was ready for processing.

Loading a 3A Dried Sample into the Harrick Cell in Nitrogen . . . (Nitrogen Dry Box)

A cleaned, assembled cell, with Teflon plugs (separate; not inserted), a clean 1 ml BD syringe and the selected sample that had been dried over 3A molecular sieves, still in the sample bottle, were placed in the dry box described above in the manner described.

The sample bottle was opened and the liquid poured into the clean 15 ml BD syringe with a 0.45 micrometer PTFE Lure Lock filter. Using the syringe, the liquid was transferred through the filter into a clean, dry 20 ml vial. Approximately 0.5 ml of the thus filtered sample was transferred into the cell using a clean 1 ml BD glass syringe the plunger of which was gently pushed to fill the cell. The cell was filled and secured as described above.

Loading a Bulb to Bulb Purified Sample into the Liquid Cell in Nitrogen . . . (Nitrogen Dry Box)

A cleaned, assembled cell, with Teflon plugs (separate; not inserted), a clean 1 ml BD syringe and the selected sample that had been dried by bulb to bulb fractional distillation, still in the sample bottle, were placed in the dry box described above in the manner described.

The sample flask was opened and the contents poured into the clean dried sample vials supplied. From one such sample vial, approximately 0.5 ml of the filtered sample was transferred using a clean 1 ml BD glass syringe, Into the liquid cell by gently pushing up on the plunger to fill the cell. The cell was filled until the liquid meniscus began to exit the top Luer Lock fitting on the cell. No trapped bubbles were permitted to reside in the cell aperture, then the top Luer Lock fitting was capped with the Teflon plug supplied, and the cell was inverted with the syringe still attached. The syringe was twisted off, the thus exposed fitting was capped with another Teflon plug. The sample so prepared was ready for processing.

TABLE 3

10% PCD Lifetimes of Treated Samples

| Ex. | Solvent | Thickness um | Pretreatment | Dose (J/cm$^2$) | 10% PCD Life-time (J/cm$^2$) | Water Content (ppm) |
|---|---|---|---|---|---|---|
| 1 | Vertrel ™ XF | 6 | Sparge | 6 | 128.2 | 0.71 |
| 2 | Vertrel ™ XF | 6 | Sparge | 20 | 200.4 | 0.71 |
| 3 | H-Galden ® ZT 85 | 25 | Sparge | 6 J | 497 | 0.94 |
| 4 | H-Galden ® ZT 85 | 25 | Mol. Sieve | 12.5 | 457 | 0.94 |
| 5 | H-Galden ® ZT 85 | 25 | Mol. Sieve | 25.4 | 868 | 0.94 |
| 6 | H-Galden ® ZT 85 | 25 | Mol. Sieve | 12.75 J | 569 | 0.94 |

TABLE 4

Effect of Drying over 3A Molecular Sieves

| | | PPM H$_2$O | |
|---|---|---|---|
| Ex. # | Description | As received | Dried |
| 7 | H-Galden ® | 257 | 0.94 |
| 8 | Solkane ™ 365 mfc | 218 | 12 |
| 9 | Vertrel ™ XF | 72 | 0.71 |

TABLE 5

| Ex. # | Fig # | Material | A/cm 157 nm | A/cm 193 nm | Thick. um | ppm O2 | ppm H2O | As Rec'd | Load in | Shake H2O | Mol. Sieve | Bulb to Bulb |
|---|---|---|---|---|---|---|---|---|---|---|---|---|
| 10 | 7 | Hydrofluorocarbonether CF3CF2CF2OCF(CF3)CF2—OCFHCF3 | 1.32 | 0.111 | 500/920/2200 | | | X | N2 | | x | |
| C8 | 8 | Perfluoro (1,3-dimethylcyclohexane) | 329 | 1 | 25/100 | | | x | Air | — | — | — |
| 11 | 10 | Perfluoro-N-methymorpholine | 9.32 | −0.05 | 100/500/920 | | | x | Air | | x | |
| | 10 | Perfluoro-N-methymorpholine | 1.78 | −0.09 | 100/500/920 | | | x | N2 | | x | |

TABLE 5-continued

| Ex. # | Fig # | Material | A/cm 157 nm | A/cm 193 nm | Thick. um | ppm O2 | ppm H2O | As Rec'd | Load in | Shake H2O | Mol. Sieve | Bulb to Bulb |
|---|---|---|---|---|---|---|---|---|---|---|---|---|
|  | 10 | Perfluoro-N-methymorpholine | 4.61 | 0.08 | 100/500/920 |  |  |  | N2 | x |  |  |
|  | 10 | Perfluoro-N-methymorpholine | 2.00 | 0.11 | 100/500/920 |  |  |  | N2 | x | x |  |
| 12 | 8 | Perfluoroether CF3CF2CF2OCF(CF3)CF2—OCF2CF3 | 0.837 | 0.139 | 2200/3180/ 4090 |  |  | x | N2 |  | x |  |
| 14 |  | Perfluoroether CF3O(CF2O)xCF2CF2O(CF2O)yCF3 | <2 | <2 |  |  |  |  | N2 |  |  |  |
| 13 | 12 | 1,1,1,3,3-Pentafluorobutane Solkane ™ 365 mfc $CF_3CH_2CF_2CH_3$ | 28.17 | 19.9 | 25/100/500 |  |  | X | Air |  |  |  |
|  | 12 | 1,1,1,3,3-Pentafluorobutane Solkane ™ 365 mfc $CF_3CH_2CF_2CH_3$ | 8.13 | 16.3 | 25/100/500 |  |  |  | N2 |  |  | X |

Comparative Example 1

Liquid sample cells having $CaF_2$ windows spaced 6 μm and 25 μm apart were used. Transmitted light intensities were measured with the cells empty and with the cells filled with ~$N(CF_2CF_2CF_2CF_3)_3$, Fluorinert™ FC-40. ~$N(CF_2CF_2CF_2CF_3)_3$, Fluorinert™ FC-40 was found have A/μm=0.21 at 157 nm.

A sample of FC-40 as received was loaded into a liquid sample cell with 6 micrometer spacers, and then irradiated with 1.1 Joules/cm² of 157 nm radiation. This material had a 10% PCD lifetime of <0.2 Joules/cm²

Comparative Example 2

Liquid sample cells having $CaF_2$ windows spaced 6 μm and 25 μm apart were used. Transmitted light intensities were measured with the cells filled with Vertrel® XF. Vertrel® XF was found have A/μm=0.0026 at 157 nm.

A sample of Vertrel® XF as received was loaded into a liquid sample cell with 6 micrometer spacers, and then irradiated with 3 Joules/cm² of 157 nm radiation. This sample showed a 10% PCD lifetime of 9.9 Joules/cm².

Comparative Example 3 and Example 1

A sample of Vertrel® XF as received was loaded into a liquid sample cell with 6 micrometer spacers, and then irradiated with 6 Joules/cm² of 157 nm radiation. This sample showed a 10% PCD lifetime of 52.7 Joules/cm².

A sample of Vertrel® XF which was vigorously sparged for 1 minute was loaded into a liquid sample cell with 6 micrometer spacers, and then irradiated with 6 Joules/cm² of 157 nm radiation. This sample showed a 10% PCD lifetime of 128.2 Joules/cm².

Comparative Example 4 and Example 2

A sample of Vertrel® XF as received was loaded into a liquid sample cell with 6 micrometer spacers, and then irradiated with 20 Joules/cm² of 157 nm radiation. This sample showed a 10% PCD lifetime of 47.5 Joules/cm².

A sample of Vertrel® XF which was vigorously sparged for 1 minute was loaded into a liquid sample cell with 6 micrometer spacers, and then irradiated with 20 Joules/cm² of 157 nm radiation. This sample showed a 10% PCD lifetime of 200.4 Joules/cm².

Example 3

Liquid sample cells having $CaF_2$ windows spaced 6 micrometer and 25 micrometer apart were used. Transmitted light intensities were measured with the cells filled with H-Galden® ZT 85. H-Galden® ZT 85 was found have A/μm=0.0037 at 157 nm.

A sample of H-Galden® ZT 85 which was vigorously sparged for 1 minute was loaded into a liquid sample cell with 25 micrometer spacers, and then irradiated with 6 Joules/cm² of 157 nm radiation. This sample showed a 10% PCD lifetime of 497 Joules/cm².

Comparative Example 5

A sample of H-Galden® ZT 85 as received was loaded into a liquid sample cell with 25 micrometer spacers, and then irradiated with 15 Joules/cm² of 157 nm radiation. Bubbles formed in the liquid cell.

Comparative Example 6

A sample of H-Galden® ZT 85 as received was loaded into a liquid sample cell with 25 micrometer spacers, and then irradiated with 30 Joules/cm² of 157 nm radiation. Bubbles formed in the liquid cell Comparative Example 7

A sample of H-Galden® ZT 85 with no pretreatment was loaded into a liquid sample cell with 25 micrometer spacers, and then irradiated with 30 Joules/cm² of 157 nm radiation. Bubbles formed in the liquid cell.

Example 4

A Hastelloy tube about two feet long by 1 inch in diameter was loaded with 3A molecular sieves, placed in a 310° C. tube oven, and purged with nitrogen gas overnight. The next morning the nitrogen purge gas was first passed through a liquid nitrogen chilled trap to make sure it was reasonably dry for the remainder of the experiment. The tube furnace was then turned off and the molecular sieves allowed to return to room temperature while maintaining the purge of dry nitrogen. About 1-2 grams of dry 3A molecular sieves were poured directly out the back end of the Hastelloy tube into a one ounce sample vial already containing 10 ml of H-Galden® ZT 85 solvent. The vial was immediately capped with a rubber septum and then rolled overnight to make sure of good contact between the solvent and the 3A molecular sieves.

The H-Galden® ZT 85 sample was filtered using a 0.45 micron glass syringe filter. A sample of thus treated H-Galden® ZT 85 was loaded into a liquid sample cell with 25 micrometer spacers, and then irradiated with 157 nm radiation. The irradiation was done in an initial dose of 12.5 Joules/cm$^2$ followed by a final dose of 36 Joules/cm$^2$, to produce a total dose of 48.5 Joules/cm$^2$. The 10% PCD lifetime over the initial dose was 457 Joules/cm$^2$.

Figure 4:
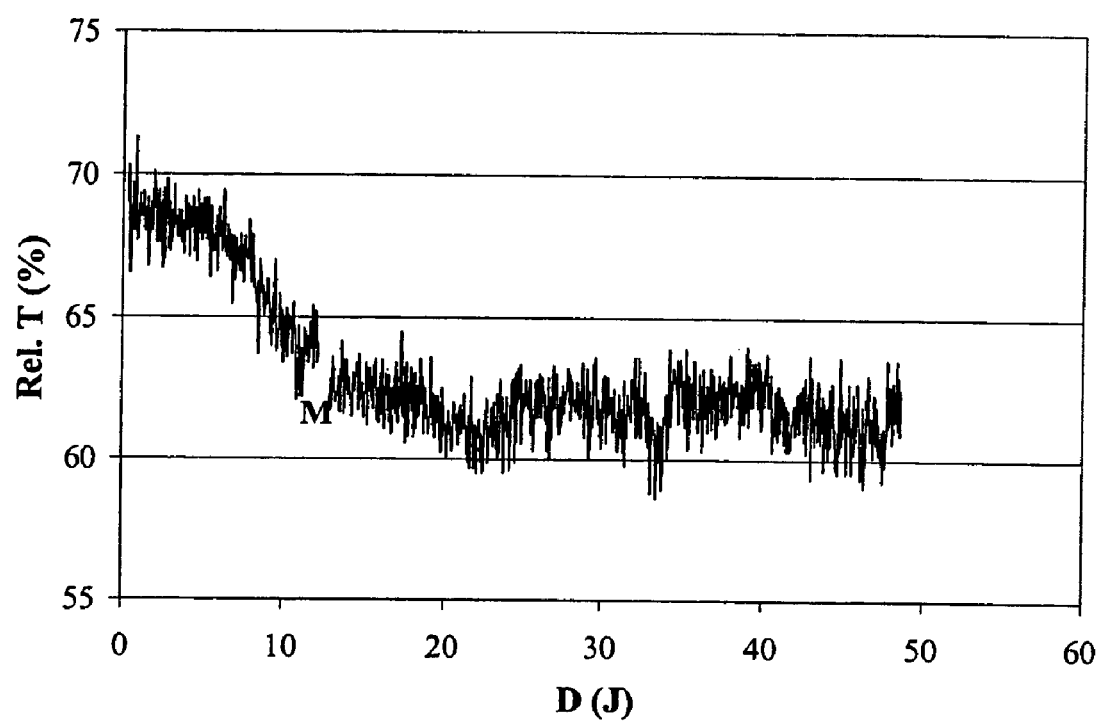
FIG. 4 shows the relative spectral transmittance of H-Galden® ZT85 as a function of laser irradiation dose as described in Example 4.

The relative transmission to dose for is shown in FIG. 4. Pyroelectric detectors (Scientech PHF-25, Scientech, Inc. Boulder, Colo.) and a power meter/ratiometer (Scientech model Vector D200) which were built in to the laser irradiation set-up as shown in FIG. 1, were used to measure the in situ variation of the relative sample transmission with increasing laser radiation dose. FIG. 4, shows a rapid decrease in the transmission during the initial 12.5 Joule dose. After the initial dose the sample had been removed at point M for a spectroscopic measurement and then replaced in the laser irradiation apparatus for administration of the subsequent irradiation dose.

The large initial transient in the photochemical darkening, which then stabilizes beyond a certain dose as shown by the relative transmission to dose in FIG. 4 demonstrated that for applications which require stability in the transmission over long doses, for example immersion lithography or a liquid pellicle, then preconditioning of the material directly prior to use may produce very long and stable transparency.

Example 5

The methods of Example 4 were repeated again using H-Galden® ZT85. The laser irradiation was done in an initial dose of 25.4 Joules/cm$^2$ followed by a final dose of 87.5 Joules/cm$^2$, to produce a total dose of 113 Joules/cm$^2$. The 10% PCD lifetime over the initial 25.4 Joule dose was 868 Joules/cm$^2$.

Figure 5:
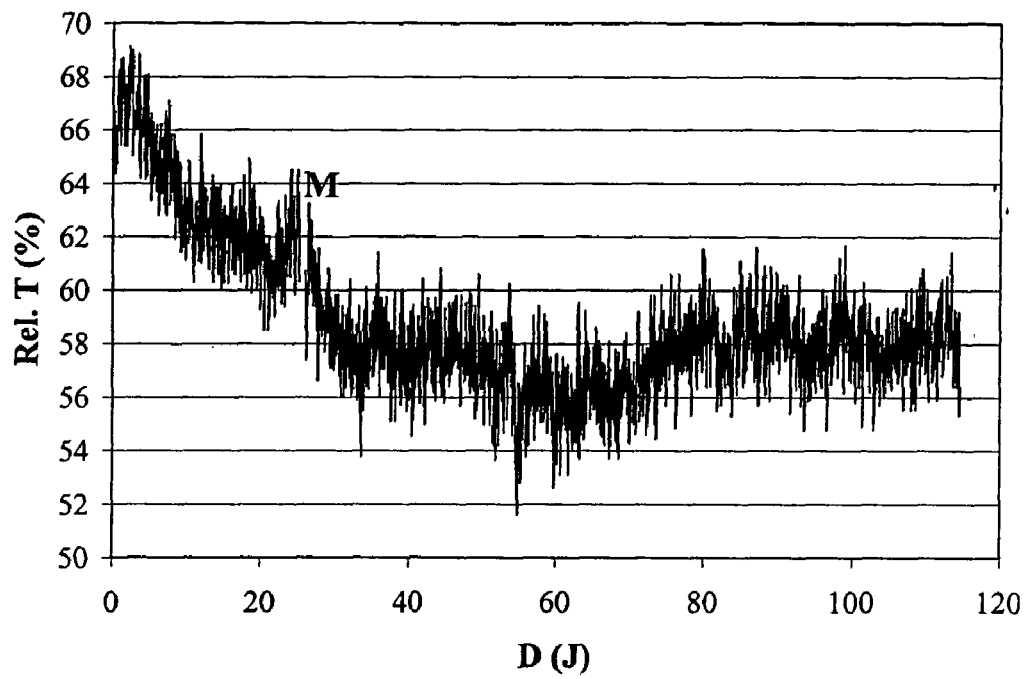
FIG. 5 shows the relative spectral transmittance of H-Galden® ZT85 as a function of laser irradiation dose as described in Example 5.

The relative transmission to dose was determined as in Example 4 and is shown in FIG. 5 where M represents the same interruption in irradiation. The relative transmission to dose during the final 87.5 Joule dose was nearly constant.

Example 6

The methods and materials of Example 4 were repeated to prepare a specimen of H-Galden® ZT85 for testing. The irradiation was done in an initial dose of 12.75 Joules/cm$^2$ followed by a final dose of 12.25 Joules/cm$^2$, to produce a total dose of 25 Joules/cm$^2$. The 10% PCD lifetime over the initial 12.75 Joule dose was 569 Joules/cm$^2$.

Figure 6:
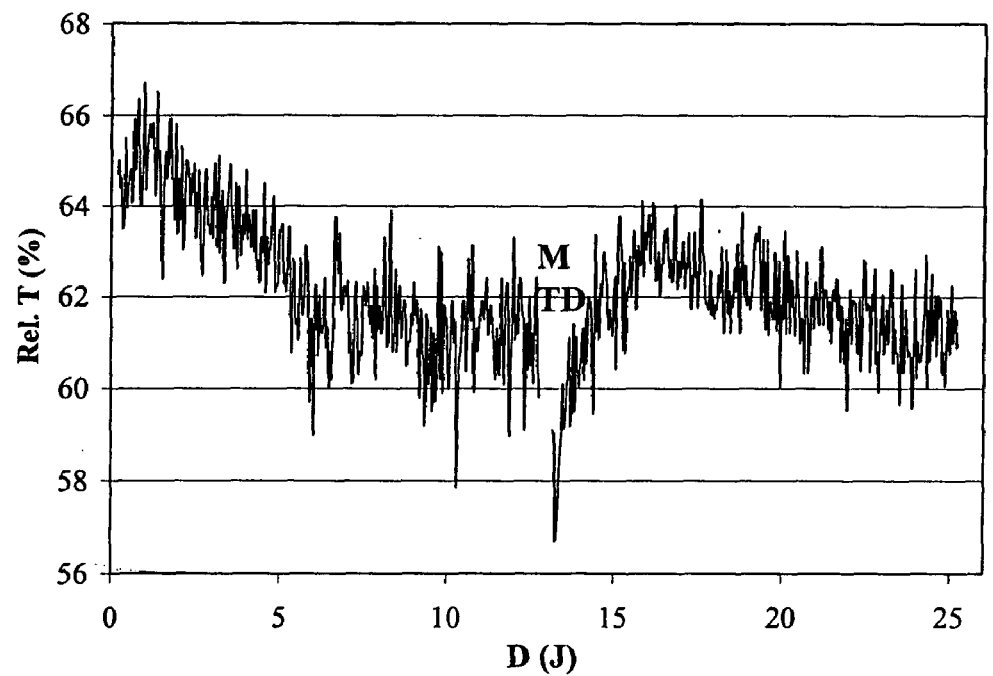
FIG. 6 shows the relative spectral transmittance of H-Galden® ZT85 as a function of laser irradiation dose as described in Example 6.

The relative transmission to dose is shown in FIG. 6. M represents the same relatively short interruption of irradiation as in FIGS. 4 and 5. TD represents an interruption of 16 hours between the initial and final doses.

Example 7

A one ounce sample vial was loaded with 10 ml of H-Galden® ZT 85 solvent and immediately capped with a rubber septum. Karl Fisher analysis of this H-Galden® ZT 85 found 257 ppm of water. H-Galden® ZT 85 as supplied by the vendor and as handled in ordinary glassware under ordinary laboratory conditions can be thus be expected to contain about 257 ppm of water.

A Hastelloy tube about two foot long by 1 inch in diameter was loaded with 3A molecular sieves, placed in a 310° C. tube oven, and purged with nitrogen gas overnight. The next morning the nitrogen purge gas was first passed through a liquid nitrogen chilled trap to make sure it was reasonably dry for the remainder of the experiment. The tube furnace was then turned off and the molecular sieves allowed to return to room temperature while maintaining the purge of dry nitrogen. About 1-2 grams of dry 3A molecular sieves were poured directly out the back end of the Hastelloy tube into a one ounce sample vial already containing 10 ml of H-Galden® ZT 85 solvent. The vial was immediately capped with a rubber septum and then rolled overnight to make sure of good contact between the solvent and the 3A molecular sieves. A sample syringed out for Karl Fisher analysis analyzed for 0.94 ppm water.

Example 8

A one ounce sample vial was loaded with 10 ml of Solkane™ 365 mfc solvent and immediately capped with a rubber septum. Karl Fisher analysis of this Solkane™ 365 mfc found 218 ppm of water. Solkane™ 365 mfc as supplied by the vendor and as handled in ordinary glassware under ordinary laboratory conditions can be thus be expected to contain about 218 ppm of water.

A Hastelloy tube about two foot long by 1 inch in diameter was loaded with 3A molecular sieves, placed in a 310° C. tube oven, and purged with nitrogen gas overnight. The next morning the nitrogen purge gas was first passed through a liquid nitrogen chilled trap to make sure it was reasonably dry for the remainder of the experiment. The tube furnace was then turned off and the molecular sieves allowed to return to room temperature while maintaining the purge of dry nitrogen. About 1-2 grams of dry 3A molecular sieves were poured directly out the back end of the Hastelloy tube into a one ounce sample vial already containing 10 ml of Solkane™ 365 mfc solvent. The vial was immediately capped with a rubber septum and then rolled overnight to make sure of good contact between the solvent and the 3A molecular sieves. A sample syringed out for Karl Fisher analysis analyzed for 12 ppm water.

Example 9

A one ounce sample vial was loaded with 10 ml of Vertrel™ XF solvent and immediately capped with a rubber septum. Karl Fisher analysis of this Vertrel™ XF found 72 ppm of water. Vertrel™ XF as supplied by the vendor and as handled in ordinary glassware under ordinary laboratory conditions can be thus be expected to contain about 72 ppm of water.

A Hastelloy tube about two foot long by 1 inch in diameter was loaded with 3A molecular sieves, placed in a 310° C. tube oven, and purged with nitrogen gas overnight. The next morning the nitrogen purge gas was first passed through a liquid nitrogen chilled trap to make sure it was reasonably dry for the remainder of the experiment. The tube furnace was then turned off and the molecular sieves allowed to return to room temperature while maintaining the purge of dry nitrogen. About 1-2 grams of dry 3A molecular sieves were poured directly out the back end of the Hastelloy tube into a one ounce sample vial already containing 10 ml of Vertrel™ XF solvent. The vial was immediately capped with a rubber septum and then rolled overnight to make sure of good contact between the solvent and the 3A molecular sieves. A sample syringed out for Karl Fisher analysis analyzed for 0.71 ppm water.

Example 10

CF3CF2CF2OCF(CF3)CF2OCFHCF3 was obtained from DuPont as Freon® E2. A mixture of Freon E2 (220 ml) and Na2CO3 (8 g) was heated to 100° C. for 1 hour. Distillation of the mixture gave a cloudy liquid (17.5 g) and a clear liquid (200 ml). The latter was dried over molecular sieves overnight. After removal of the molecular sieves, the liquid was distilled using a nitrogen purged spinning band column. The fraction boiling below 97° C. was excluded. The next two cuts (bp 98-99° C. and bp 99-99.5° C.) were collected separately. The fraction bp 98-99° C. was transferred to a N2 bag, then dried over molecular sieves and purged with N2.

Figure 7:
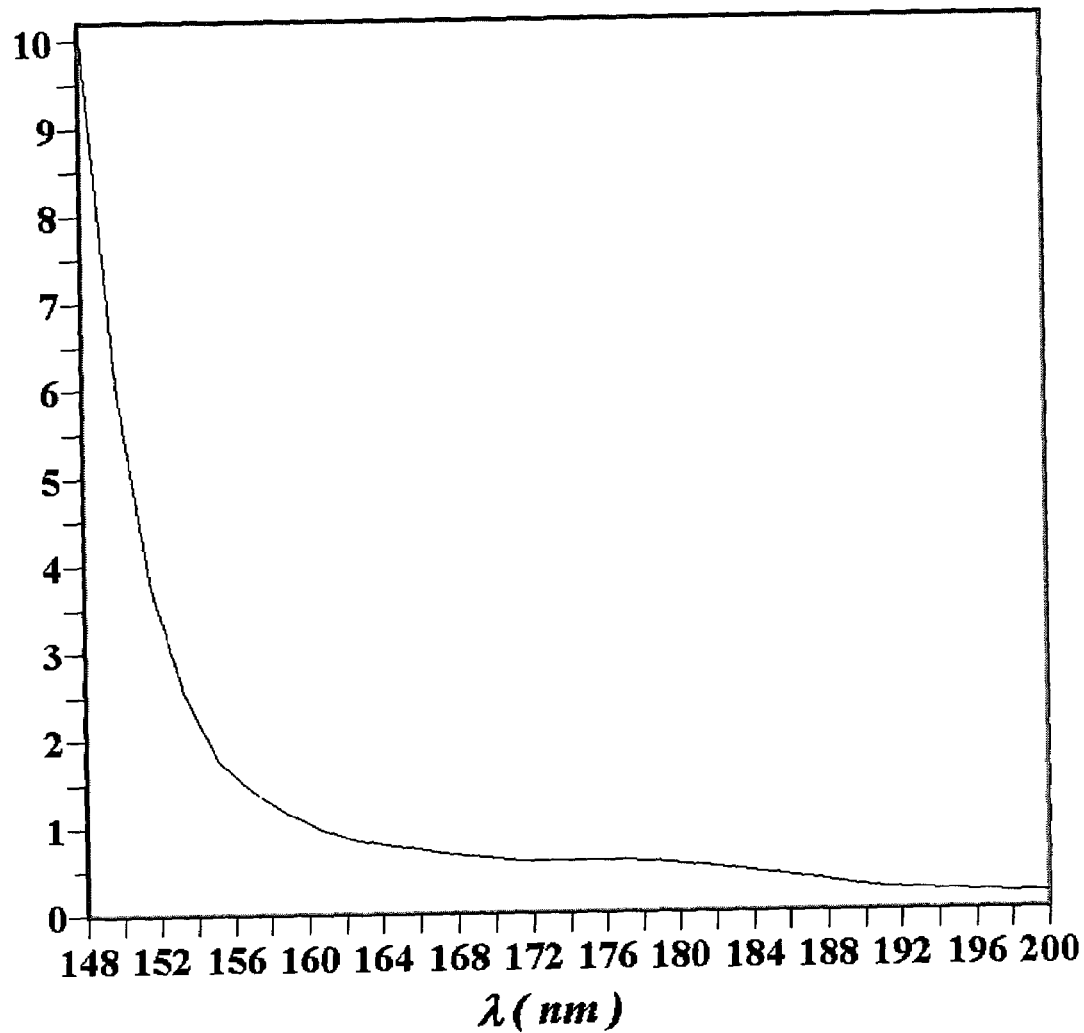
FIG. 7 describes the absorbance in units of inverse centimeters for CF$_3$CF$_2$CF$_2$OCF(CF$_3$)CF$_2$OCFHCF$_3$) (Formulation #10908) (Example 10) versus wavelength lambda ($\lambda$) in units of nanometers.

The absorbance/centimeter of the sample was determined using the relative transmission method with cell thicknesses of 500/920/2200 micrometers using the methods discussed above. The sample was dried over molecular sieves and loaded under N2. The optical absorbance per centimeter at 157 nm was 1.32/cm and the optical absorbance per centimeter at 193 nm was 0.111/cm. The results are shown in FIG. 7 and summarized in Table 5.

Comparative Example 8

Perfluoro(1,3-dimethylcyclohexane)

High Absorption @ 157 and 193 nm compared to perfluoro-N-methylmorpholine

A sample of perfluoro(1,-3-dimethylcyclobutane) was purchased from SynQuest Laboratories, Inc. (Perfluoro-1,3-dimethylcyclohexane, 98% minimum, catalog 1200-2-07)

Figure 8:
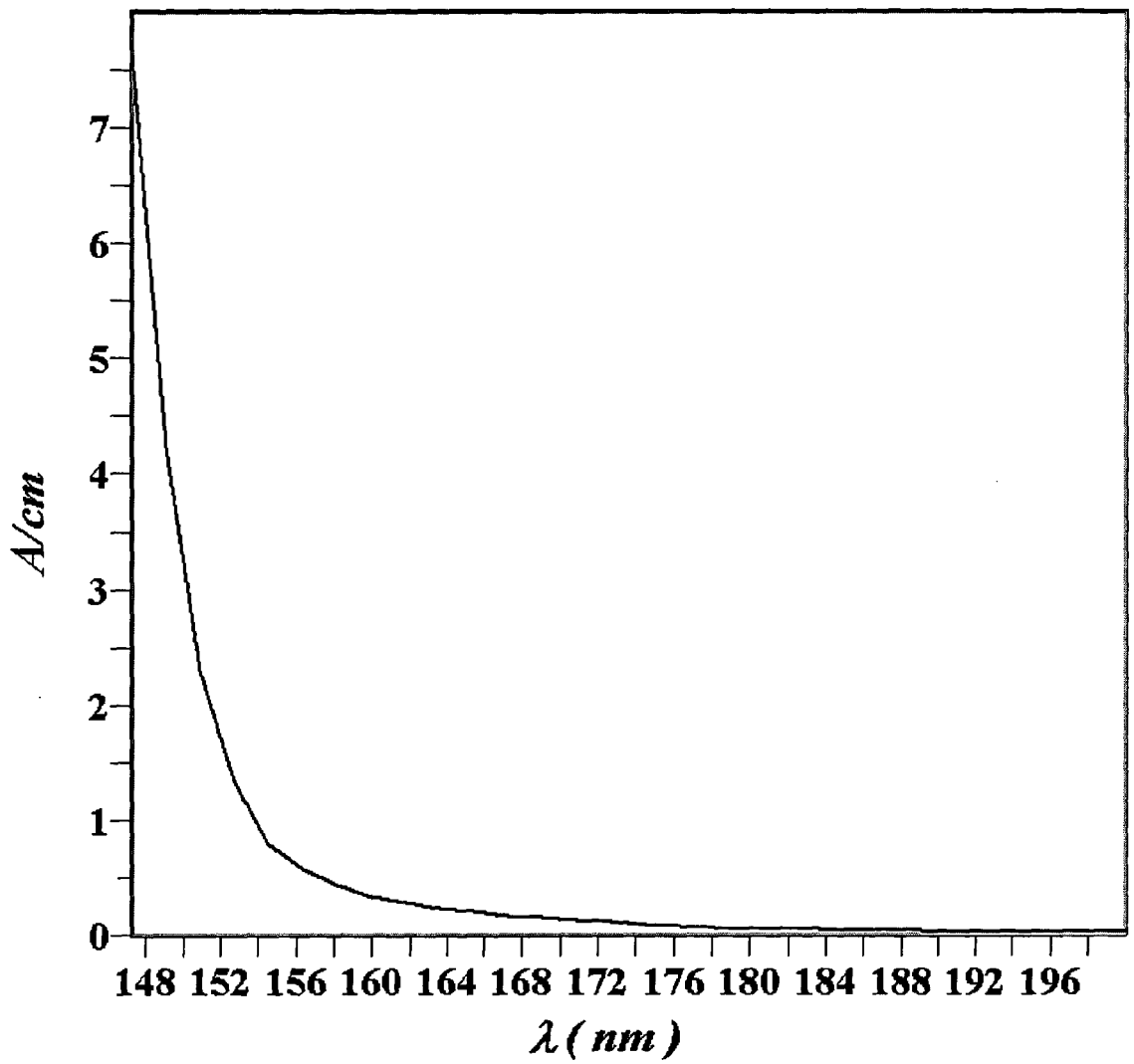
FIG. 8 Describes the absorbance in units of inverse centimeters for CF$_3$CF$_2$CF$_2$OCF(CF$_3$)CF$_2$OCF$_2$CF$_3$ (Formulation #10894) (Example 12) versus wavelength lambda ($\lambda$) in units of nanometers.
Figure 9:
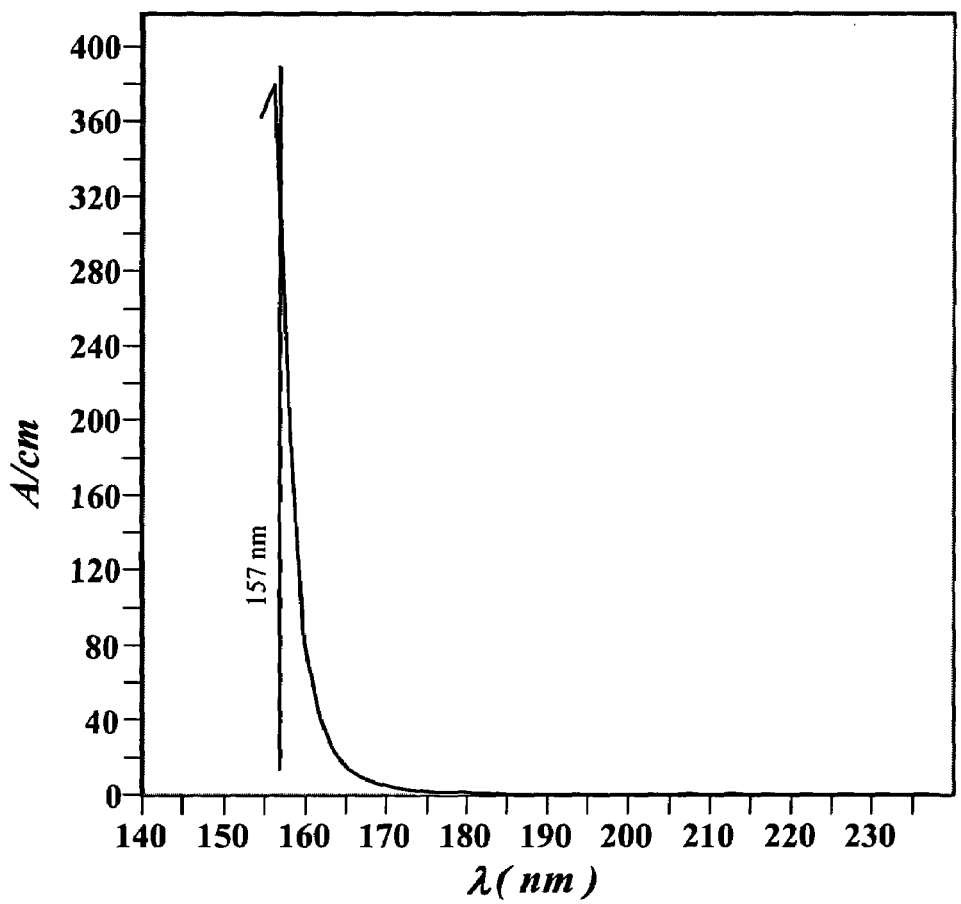
FIG. 9 describes the absorbance in units of inverse centimeters for Perfluoro(1,3-dimethylcyclohexane) (Example C9) versus wavelength lambda ($\lambda$) in units of nanometers.

The absorbance/centimeter of the sample was determined using the relative transmission method with cell thicknesses of 25/100 micrometers, using the methods discussed above. The sample was as received which was loaded in air. The optical absorbance per centimeter at 157 nm was 329/cm, and the optical absorbance per centimeter at 193 nm was 1/cm. The results are shown in FIG. 8 and summarized in Table 5.

Example 11

Perfluoro-N-methymorpholine

Low Absorption of Cyclic Perfluorocarbons with O and N Substitution in Ring

Perfluoro-N-methylmorpholine is structurally quite similar to perfluoro-1,3-dimethylcyclohexane, except in the case of the perfluoro-N-methyl-morpholine several of the ring carbons have been replaced by O and N. Perfluoro-N-methylmorpholine was purchased from 3M under the name PF-5052 3M® Brand Performance Fluid.

The absorbance/centimeter of the loaded in air sample was determined using the relative transmission method with cell thicknesses of 100/500/920 micrometers, using the methods discussed above. The sample was as received which was loaded in air. The optical absorbance per centimeter at 157 nm was 9.32/cm, and the optical absorbance per centimeter at 193 nm was −0.05/cm. The results are shown in FIG. 10 and summarized in Table 5.

The absorbance/centimeter of the loaded in N2 sample was determined using the relative transmission method with cell thicknesses of 100/500/920 micrometers, using the methods discussed above. The sample was as received which was loaded in a nitrogen environment. The optical absorbance per centimeter at 157 nm was 1.78/cm, and the optical absorbance per centimeter at 193 nm was −0.09/cm. The results are shown in FIG. 10 and summarized in Table 5.

The absorbance/centimeter of the loaded in N2, shaken with water sample was determined using the relative transmission method with cell thicknesses of 100/500/920 micrometers, using the methods discussed above. The sample was as received then shaken with water which was loaded in a nitrogen environment. The optical absorbance per centimeter at 157 nm was 4.61/cm, and the optical absorbance per centimeter at 193 nm was 0.08/cm. The results are shown in FIG. 10 and summarized in Table 5.

The absorbance/centimeter of the loaded in N2, shaken with water and exposed to 3A sieves sample was determined using the relative transmission method with cell thicknesses of 100/500/920 micrometers, using the methods discussed above. The sample was as received and then shaken with water which was loaded in a nitrogen environment and then exposed to molecular sieves. The optical absorbance per centimeter at 157 nm was 2.0/cm, and the optical absorbance per centimeter at 193 nm was 0.11/cm. The results are shown in FIG. 10 and summarized in Table 5.

Example 12

CF3CF2CF2OCF(CF3)CF2OCFHCF3 was obtained from DuPont as Freon® E2. A 400 ml autoclave was charged with NaF (12 g) and Freon E2 (115 g). After cooling and evacuation, the autoclave was charged 25% F2 (N2) to 120 psig at about −30° C., heated to 140° C. for 15 min, then cooled to RT and vented N2. The autoclave was charged fresh F2/N2 and this charge, heat and vent cycle was repeated for 6 times. The seventh cycle was heated to 160° C. and the last cycle was heated to 170° C. The reaction mixture was filtered to remove solids. The filtrate was distilled over Na2CO3 (1 g) to give A, bp<80° C., 4.5 g, and B bp 91-93° C., 71.5 g. Fraction A contained 5% Freon E2, two unidentified impurities and perfluoro Freon E2. Fraction B contained Freon E2 and perfluoro Freon E2 in 15:85 ratio. Repeated spinband distillation of B gave perfluoro Freon E2 with less than 2% Freon E2. 19N NMR −80.4 (m, 3F), −81.8 (t, J=7 Hz, 3F), −82.2 (m, 2F), −83.7 (m, 2F), −87.3 (s, 3F), −89.0 (t, J=22 Hz, 2F), −130.1 (q, J=3 Hz, 2F), −145.8 (t, J=21 Hz, 1F) ppm.

The absorbance/centimeter of the sample B was determined using the relative transmission method with cell thicknesses of 2200/3180/4090 micrometers using the methods discussed above. The sample was dried over molecular sieves and loaded under N2. The optical absorbance per centimeter at 157 nm was 0.837/cm and the optical absorbance per centimeter at 193 nm was 0.139/cm. The results are shown in FIG. 8 and summarized in Table 5.

Example 13

Figure 12:
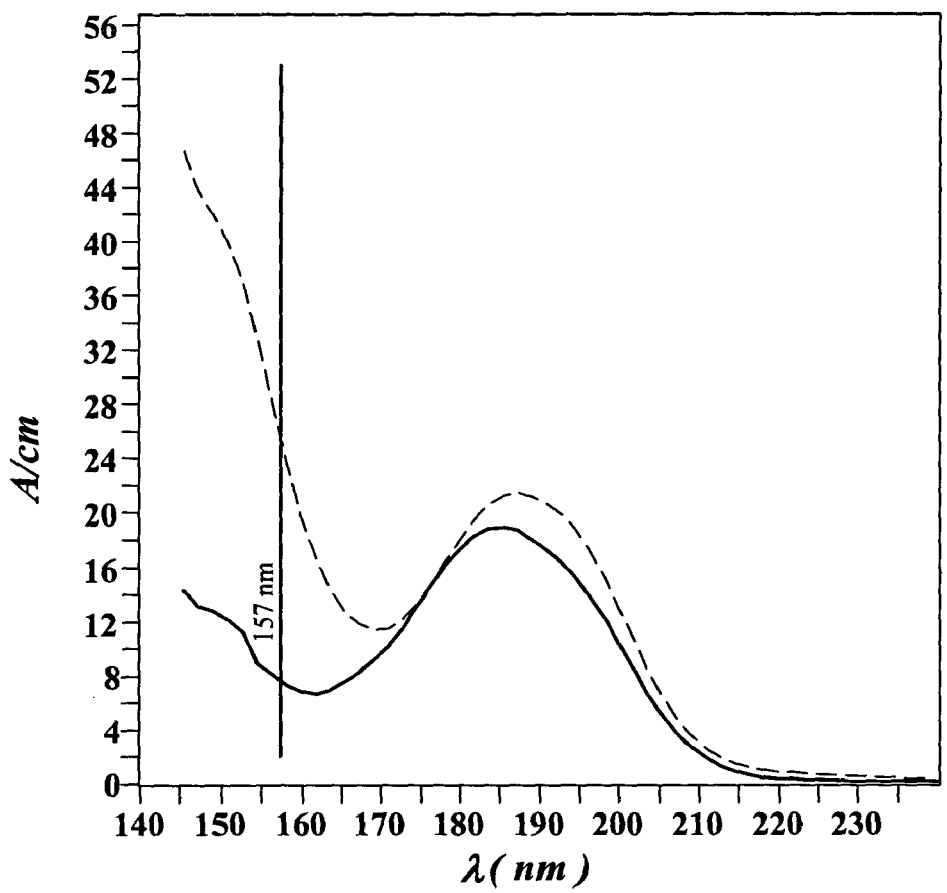
FIG. 12 describes the absorbance in units of inverse centimeters for 1,1,1,3,3-Pentafluorobutane (Example 13) versus wavelength lambda ($\lambda$) in units of nanometers for a sample a) loaded in Air (dashed line), b) loaded in N$_2$ after bulb to bulb distillation (solid line).

Bulb-to-bulb Distillation of 1,1,1,3,3-Pentafluorobutane (Solkane™ 365 mfc), $CF_3CH_2CF_2CH_3$ The 1,1,1,3,3-pentafluorobutane was first tested as received. The sample was loaded in air. The absorbance/centimeter was determined using the relative transmission method with cell thicknesses of 25/100/500 micrometers, using the methods discussed above. The optical absorbance per centimeter at 157 nm was 28.17/cm, and the optical absorbance per centimeter at 193 nm was 19.9/cm. The results are shown in FIG. 12 and summarized in Table 5.

A 400 ml Hastelloy autoclave was loaded with 200 g of this 1,1,1,3,3-pentafluorobutane, 3 g of potassium permanganate, and 100 ml of water and shaken for 24 hours at 100° C. The lower layer was separated from the reaction mixture and distilled taking a center cut of about 100 ml. Fifty ml of this center cut were used for the bulb-to-bulb distillation that follows.

Clean, grease-free glassware was used. Seals were made using grease-free Viton™ o-rings positioned so that liquid phase fluid never comes in contact with the o-rings. A quartz tube 1" in diameter by 22" long was packed with an inch of stainless steel turnings. These turnings were located about 6" from bottom end of the tube and were packed tight enough to provide support for a 6" high bed of 3A molecular sieves. A 100 ml flask, equipped with a vacuum stopcock side arm adapter to N2/air/vacuum lines, was attached to the bottom end of the quartz tube. The quartz tube was then placed in a furnace so that the 6" column of molecular sieves ended up entirely in a 12" long heater zone. A flow of air was started through the furnace and the molecular sieves heated to 500° C. for 2 hours. The air flow was changed for a nitrogen flow that had been passed through a liquid N2 trap and the furnace cooled to 100° C. The nitrogen flow was stopped, a 100 ml flask connected to the top end of the quartz tube via a detachable vacuum stopcock, and pump vacuum applied to the whole system while the flask and stopcock at the top of the quartz tube were heated with a forced air gun. The apparatus was then allowed to cool to room temperature under vacuum. The vacuum was relieved and 50 ml of 1,1,1,3,3-pentafluorobutane added to the flask at the bottom of the quartz tube. The system was resealed and the 1,1,1, 3,3-pentafluorobutane frozen by application of a liquid nitrogen bath. Pump vacuum was pulled and system sealed off under vacuum. The 1,1,1,3,3-pentafluorobutane was then allowed to thaw so that dissolved oxygen could escape into the surrounding vacuum. The 1,1,1,3,3-pentafluorobutane was refrozen and high vacuum reapplied, removing evolved oxygen from the system. This freeze thaw cycle was repeated another two times. After the end of the third such freeze-thaw cycle, the 1,1,1,3,3-pentafluorobutane was refrozen and a fresh vacuum pulled. The system was sealed off under vacuum and the liquid nitrogen cooling bath transferred from the flask containing the 1,1,1,3,3-pentafluorobutane to the empty flask at the top of the quartz tube. As the 1,1,1,3,3-pentafluorobutane warmed towards room temperature, it distilled under its own vapor pressure through the bed of 3A molecular sieves (absorbing water) and condensed relatively dry and oxygen free in the liquid nitrogen chilled flask at the top of the quartz tube. Once distillation was complete, the receiving flask was allowed to warm to room temperature, the system back filled with pure nitrogen, the valve at the top of the receiving flask closed off, and the flask disconnected from the system. The flask was then transferred to a glove box with pure nitrogen atmosphere where the flask could be opened and transparency measurements carried out on 1,1,1,3,3-pentafluorobutane without fear of contamination.

The absorbance/centimeter of the bulb to bulb sample was determined using the relative transmission method with cell thicknesses of 25/100/500 micrometers, using the methods discussed above. The sample was loaded in a nitrogen environment and underwent bulb to bulb distillation. The optical absorbance per centimeter at 157 nm was 8.13/cm, and the optical absorbance per centimeter at 193 nm was 16.3/cm. The results are shown in FIG. 12 and summarized in Table 5.

Example 14

CF3O(CF2O)xCF2CF2(OCF2)yCF3

Electrochemical synthesis of perfluoro-ethers: An electrochemical cell is equipped with a pack of electrodes (Pt cylinder shaped cathode and anode, anode is about 25 cm²), a magnetic stirbar, a diptube for thermocouple, condenser, and a N2 inlet. Potassium hydroxide solution (0.55 g KOH in 150 ml water), perfluoroacid CF3O(CF2O)nCF2CO2H (42.55 g, bp 66-75°/2 mmHg), water (130 ml), and acetonitrile (70 ml) are added to the reactor. The electrodes are connected to a HP 6203B DC Power supply. The electrolysis is carried out at <34° C. with water bath cooling and 0.8-1.5 A current for 8 hours. The bottom layer is isolated and washed in turn with saturated sodium carbonate aqueous solution, water, and concentrated sulfuric acid. The organic layer is isolated and distilled at reduced pressure to give 19.5 g liquid, bp 30-69° C./2 mmHg. 19F NMR analysis of the product indicated complete consumption of the starting acid and formation of the perfluoroether CF3O(CF2O)xCF2CF2 (OCF2)yOCF3.

19F NMR CF3O(CF2O)nCF2CO2H −81.4 ppm. CF3O (CF2O)xCF2CF2(OCF2)yOCF3 −90.9 m.

The absorbance/centimeter of the CF3O(CF2O)xCF2CF2 (OCF2)yOCF3 is determined by the relative transmission method at several cell thicknesses using the methods discussed above. The sample is dried with molecular sieves and loaded under N2. The optical absorbance per centimeter at both 157 and 193 nm is <2/cm. The results are summarized in Table 5.

What is claimed is:

1. A process for preparing a liquid organic composition characterized by an absorbance/micrometer of <1 at wavelengths from 140 to 260 nm, comprising subjecting to treatment with one or more means for extracting one or more photochemically active species, a liquid compound selected from the group consisting of:

i) cyclic, linear, or branched hydrofluorocarbons having 2 to 10 carbon atoms in which there are more fluorines than hydrogen, no runs of adjacent C—H bonds longer than two (CH—CH), no runs of adjacent C—F bonds longer than 6 (CF—CF—CF—CF—CF—CF), and no —CH$_2$CH$_3$ radicals;

ii) X—R$_f^a$[OR$_f^b$]$_n$OR$_f^c$Y wherein X and Y can be hydrogen or fluorine and R$_f^a$, R$_f^b$, and R$_f^c$ are 1 to 3 carbon fluorocarbon radicals, linear or branched in which there are more fluorines than hydrogens, no runs of adjacent C—H bonds longer than two are present, no —CH$_2$CH$_3$ radicals are present and no sequences with hydrogen on both sides of an ether oxygen (CH—O—CH) are present;

iii) C$_n$F$_{2n+1}$CFHCFHC$_m$F$_{2m+1}$ where n equals 1 to 4; and m equals 1 to 4;

iv) CF$_3$CH$_2$CF$_2$CH$_3$;

v) F[CF(CF$_3$)CF$_2$O]$_n$CFHCF$_3$ where n=1 to 5;

vi) F[CF(CF$_3$)CF$_2$O]$_n$CF$_2$CF$_3$ where n=1 to 5;

vii) HCF$_2$(OCF$_2$)$_n$(OCF$_2$CF$_2$)$_m$OCF$_2$H where n+m=1 to 8;

viii) cyclic, linear, or branched hydrofluorocarbon amines and ether-amines in which there are more fluorines than hydrogens, no runs of hydrogen longer than two (CH—CH), no —CH$_2$CH$_3$ radicals are present and no runs of adjacent C—F bonds longer than 6 (CF—CF—CF—CF—CF—CF), and no C—H bonds immediately adjacent to either nitrogen or oxygen; and, ix) $XR_f^a(OR_f^b)_w(OR_f^c)_x(OR_f^d)_yOR_f^eY$ where X=H or F; $R_f^a$ and $R_f^e$ are independently a linear or branched fluoroalkyl radical of 1 to 3 carbons; $R_f^b$, $R_f^c$, and $R_f^d$ are linear or branched fluoroalkenyl radicals of 1-3 carbons; and w, x, and y=0 to 10 with the proviso that w+x+y≥2;

at least until the desired concentration of said one or more photochemically active species is achieved; wherein said one or more photochemically active species comprises moisture and oxygen and the desired concentrations are below 20 parts per million and below 90 parts per million, respectively.

2. The process of claim 1 wherein said liquid compound is selected from the group consisting of $C_nF_{2n+1}CFHCFHC_mF_{2m+1}$ where n equals 1 to 4; and m equals 1 to 4 and $HCF_2(OCF_2)_n(OCF_2CF_2)_mOCF_2H$ where n=m=1 to 8.

3. The process of claim 2 wherein said liquid compound is selected from the group consisting of $CF_3CFHCFHCF_2CF_3$, $CF_3CH_2CF_2CH_3$ and $HCF_2O(CF_2O)_n(CF_2CF_2O)_mCF_2H$ where n+m=2 to 6.

4. The process of claim 1 wherein said liquid compound is selected from the group of fluoroethers consisting of a cyclic perfluoroaminoethers comprising one or more linear perfluoroalkyl radicals, perfluoroalkenyl radicals, or a combination thereof, said radicals having 1 to 6 carbons; an acyclic perfluoroether having linear or branched perfluoroalkyl radicals, perfluoroalkenyl radicals, or a combination thereof, said radicals having 1 to 6 carbons; and, an acyclic hydrofluorocarbonfluoroether having linear or branched perfluoroalkyl radicals, perfluoroalkenyl radicals, or a combination thereof, said radicals having 1 to 6 carbons and wherein in said acyclic hydrofluorocarbonfluoroether there are no geminal or adjacent hydrogens.

5. The process of claim 4 wherein the moisture and oxygen concentrations are each less than 5 parts per million by weight of the fluoroether.

6. The process of claim 5 wherein the moisture and oxygen concentrations are each less than 1 part per million by weight of the fluoroether.

7. The process of claims 4, 5 or 6 wherein said liquid compound is perfluoro-N-methylmorpholine.

8. The process of claims 4, 5, or 6 wherein said liquid compound is $CF_3(CF_2)_2OCF(CF_3)CF_2OCF_2CF_3$, $CF_3O(CF_2)_nOCF_3$ where n is 3 to 5, or $CF_3O(CF_2)_xCF_2CF_2O(CF_2O)_yCF_3$ where x and y independently are 2 or 3.

9. The process of claim 4, 5, or 6 wherein said one liquid compound is $CF_3CF_2CF_2OCF(CF_3)CF_2OCF_HCF_3$ or $CF_3O(CF_2O)_nCF_2H$ wherein n=3 to 5.

10. The process of claim 1 wherein said means comprises subjecting said liquid compound to freeze-thaw fractional distillation and contacting said liquid compound with molecular sieves.

11. The process of claim 1 wherein said means comprises sparging with an inert gas.

12. The process of claim 1 wherein said means comprises contacting said liquid compound with molecular sieves and sparging said liquid compound with an inert gas.

13. A process for forming an optical image on a substrate, the process comprising:

a) radiating elecromagnetic radiation from source capable of radiating elecromagnetic radiation in the rancie of 140 to 260 nm;

b) receiving said radiation on a target disposed to receive at least a portion of said radiation; and c) causing at least a portion of said radiation to traverse one or more optically transparent compositions disposed between said radiation source and said target, at least one of said optically transparent compositions comprising a composition comprising less than 20 parts per million of water, less than 90 parts per million of oxygen, and one or more liquid compounds selected from the group consisting of $C_nF_{2n+1}CFHCFHC_mF_{2m+1}$ where n equals 1 to 4; and m equals 1 to 4 and $HCF_2(OCF_2)_n(OCF_2CF_2)_mOCF_2H$ where n+m=1 to 8.

14. The process of claim 13 wherein said one or more liquid compounds are selected from the group consisting of $CF_3CFHCFHCF_2CF_3$, $CF_3CH_2CF_2CH_3$ and $HCF_2O(CF_2O)_n(CF_2CF_2O)_mCF_2H$ where n+m=2 to 6.

15. The process of claim 13 wherein said one or more liquid compounds are selected from the group of fluoroethers consisting of a cyclic perfluoroaminoethers comprising one or more linear perfluoroalkyl radicals, perfluoroalkenyl radicals, or a combination thereof, said radicals having 1 to 6 carbons; an acyclic perfluoroether having linear or branched perfluoroalkyl radicals, perfluoroalkenyl radicals, or a combination thereof, said radicals having 1 to 6 carbons; and, an acyclic hydrofluorocarbonfluoroether having linear or branched perfluoroalkyl radicals, perfluoroalkenyl radicals, or a combination thereof, said radicals having 1 to 6 carbons and wherein in said acyclic hydrofluorocarbonfluoroether there are no geminal or adjacent hydrogens.

16. The process of claim 15 wherein the water and oxygen concentrations are each less than 5 parts per million by weight of the fluoroether.

17. The process of claim 16 wherein the water and oxygen concentrations are each less than 1 part per million by weight of the fluoroether.

18. The process of claims 15, 16, or 17 wherein said liquid compound is perfluoro-N-methylmorpholine.

19. The process of claims 15, 16, or 17 wherein said one or more liquid compounds is $CF_3(CF_2)_2OCF(CF_3)CF_2OCF_2CF_3$, $CF_3O(CF_2)_nOCF_3$ where n is 3 to 5, or $CF_3O(CF_2)_xCF_2CF_2O(CF_2O)yCF_3$ where x and y independently are 2 or 3.

20. The process of claims 15, 16, or 17 wherein said one or more liquid compounds is $CF_3CF_2CF_2OCF(CF_3)CF_2OCFHCF_3$ or $CF_3O(CF_2O)_nCF_2H$ wherein n=3 to 5.

21. The process of claim 13 wherein said at least one of said radiation source and said target are immersed in said optically transparent composition.

22. The process of claim 13 wherein both radiation source and target are immersed in said optically transparent composition.

23. A process for forming an optical image on a substrate, the process comprising:

radiating elecromagnetic radiation from a source capable of radiating elecromagnetic radiation in the rancie of 140 to 260 nm;

receiving said radiation on a target disposed to receive at least a portion of said radiation; and wherein one or more optically transparent compositions is disposed between said radiation source and said target, at least one of said optically transparent compositions comprising a composition treated with one or more means for extracting one or more photochemically active species, the composition comprising one or more liquid compounds selected from the group consisting of:

i) cyclic, linear, or branched hydrofluorocarbons having 2 to 10 carbon atoms in which there are more fluorines than hydrogen, no runs of adjacent C—H bonds longer than two (CH—CH), no runs of adjacent C—F bonds longer than 6 (CF—CF—CF—CF—CF—CF), and no —$CH_2CH_3$ radicals;

ii) X—$R_f^a$[$OR_f^b$]$_n$$OR_f^c$Y wherein X and Y can be hydrogen or fluorine and $R_f^a$, $R_f^b$ and $R_f^c$ are 1 to 3 carbon fluorocarbon radicals, linear or branched in which there are more fluorines than hydrogens, no runs of adjacent C—H bonds longer than two are present, no —$CH_2CH_3$ radicals are present and no sequences with hydrogen on both sides of an ether oxygen (CH—O—CH) are present;

iii) $C_nF_{2n+1}$CFHCFH$C_mF_{2m+1}$ where n equals 1 to 4; and m equals 1 to 4;

iv) $CF_3CH_2CF_2CH_3$;

v) F[CF($CF_3$)$CF_2$O]$_n$CFH$CF_3$ where n=1 to 5;

vi) F[CF($CF_3$)$CF_2$O]$_n$$CF_2CF_3$ where n=1 to 5;

vii) $HCF_2$($OCF_2$)$_n$($OCF_2CF_2$)$_m$$OCF_2$H where n+m=1 to 8;

viii) cyclic, linear, or branched hydrofluorocarbon amines and ether-amines in which there are more fluorines than hydrogens, no runs of hydrogen longer than two (CH—CH), no —$CH_2CH_3$ radicals are present and no runs of adjacent C—F bonds longer than 6 (CF—CF—CF—CF—CF—CF). and no C—H bonds immediately adjacent to either nitrogen or oxygen; and, X$R_f^a$($OR_f^b$)w($OR_f^c$)$_x$($OR_f^d$)$_y$$OR_f^e$Y where X=H or F; $R_f^a$ and $R_f^e$ are independently a linear or branched fluoroalkyl radical of 1 to 3 carbons; $R_f^b$, $R_f^c$ and $R_f^d$ are linear or branched fluoroalkenyl radicals of 1-3 carbons; and w, x, and y=0 to 10 with the proviso that w+x+y>2; wherein the one or more photochemically active species comprise moisture and oxygen and the desired concentrations are below 20 parts per million and below 90 parts per million, respectively.

24. The process of claim 23 wherein said one or more liquid compounds are selected from the group consisting of $C_nF_{2n+1}$CFHCFH$C_mF_{2m+1}$ where n equals 1 to 4; and m equals 1 to 4 and $HCF_2$($OCF_2$)$_n$($OCF_2CF_2$)$_m$$OCF_2$H where n+m=1 to 8.

25. The process of claim 24 wherein said one or more liquid compounds are selected from the group consisting of $CF_3$CFHCFH$CF_2CF_3$, $CF_3CH_2CF_2CH_3$ and $HCF_2$O($CF_2$O)$_n$ ($CF_2CF_2$O)$_m$$CF_2$H where n+m=2 to 6.

26. The process of claim 24 wherein said means comprises contacting said liquid compound with molecular sieves and sparging said liquid compound with an inert gas.

27. The process of claim 23 wherein said one or more liquid compounds are selected from the group of fluoroethers consisting of a cyclic perfluoroaminoethers comprising one or more linear perfluoroalkyl radicals, perfluoroalkenyl radicals, or a combination thereof, said radicals having 1 to 6 carbons; an acyclic perfluoroether having linear or branched perfluoroalkyl radicals, perfluoroalkenyl radicals, or a combination thereof, said radicals having 1 to 6 carbons; and, an acyclic hydrofluorocarbonfluoroether having linear or branched perfluoroalkyl radicals, perfluoroalkenyl radicals, or a combination thereof, said radicals having 1 to 6 carbons and wherein in said acyclic hydrofluorocarbonfluoroether there are no geminal or adjacent hydrogens.

28. The process of claim 27 wherein the moisture and oxygen concentrations are each less than 5 parts per million by weight of the fluoroether.

29. The process of claim 28 wherein the moisture and oxygen concentrations are each less than 1 part per million by weight of the fluoroether.

30. The process of claims 27, 28, or 29 wherein said liquid compound is perfluoro-N-methylmorpholine.

31. The process of claims 27, 28, or 29 wherein said one or more liquid compounds is $CF_3$($CF_2$)$_2$OCF($CF_3$)$CF_2OCF_2CF_3$, $CF_3$O($CF_2$)$_n$$OCF_3$ where n is 3 to 5, or $CF_3$O($CF_2$)$_x$$CF_2CF_2$O($CF_2$O)$_y$$CF_3$ where x and y independently are 2 or 3.

32. The process of claims 27, 28, or 29 wherein said one or more liquid compounds is $CF_3CF_2CF_2$OCF($CF_3$)$CF_2$OCFH$CF_3$ or $CF_3$O($CF_2$O)$_n$$CF_2$H wherein n=3 to 5.

33. The process of claim 23 wherein said means comprises subjecting said compound to freeze-thaw fractional distillation and contacting said compound with molecular sieves.

34. The process of claim 23 wherein said means comprises sparging with an inert gas.

35. The process of claim 23 wherein said at least one of said radiation source and said target are immersed in said optically transparent composition.

36. The process of claim 23 wherein both radiation source and target are immersed in said optically transparent composition.

* * * * *